United States Patent
Momo et al.

(10) Patent No.: US 8,377,804 B2
(45) Date of Patent: Feb. 19, 2013

(54) MANUFACTURING METHOD OF SEMICONDUCTOR SUBSTRATE AND SEMICONDUCTOR DEVICE

(75) Inventors: Junpei Momo, Sagamihara (JP); Kosei Nei, Atsugi (JP); Hiroaki Honda, Atsugi (JP); Masaki Koyama, Atsugi (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 559 days.

(21) Appl. No.: 12/568,761

(22) Filed: Sep. 29, 2009

(65) Prior Publication Data

US 2010/0084734 A1    Apr. 8, 2010

(30) Foreign Application Priority Data

Oct. 2, 2008 (JP) ................. 2008-257760

(51) Int. Cl.
*H01L 21/20* (2006.01)
*H01L 21/30* (2006.01)

(52) U.S. Cl. ........ 438/487; 438/513; 438/458; 438/459; 257/E21.133

(58) Field of Classification Search ........... 257/E21.133; 438/513, 977, 487, 459, 455, 458
See application file for complete search history.

(56) References Cited

U.S. PATENT DOCUMENTS

| | | | |
|---|---|---|---|
| 4,390,392 A * | 6/1983 | Robinson et al. | 438/473 |
| 5,374,564 A * | 12/1994 | Bruel | 438/455 |
| 6,027,988 A * | 2/2000 | Cheung et al. | 438/513 |
| 6,061,375 A * | 5/2000 | Zhang et al. | 372/58 |
| 6,372,609 B1 * | 4/2002 | Aga et al. | 438/459 |
| 6,534,380 B1 | 3/2003 | Yamauchi et al. | |
| 6,770,507 B2 * | 8/2004 | Abe et al. | 438/64 |
| 6,875,633 B2 * | 4/2005 | Fukunaga | 438/107 |

(Continued)

FOREIGN PATENT DOCUMENTS

| | | |
|---|---|---|
| JP | 11-097379 A | 4/1999 |
| JP | 2000-294754 A | 10/2000 |

(Continued)

OTHER PUBLICATIONS

Lv et al. The uniformity of InGaAs in InP/InGaAs/InP by microwave photoconductivity decay carrier lifetime measurement. Semiconductor Sci. Technol. 21 (2006), pp. 771-774.*

(Continued)

*Primary Examiner* — Colleen Matthews
*Assistant Examiner* — Galina Yushina
(74) *Attorney, Agent, or Firm* — Eric J. Robinson; Robinson Intellectual Property Law Office, P.C.

(57) ABSTRACT

To provide a semiconductor substrate in which a semiconductor element having favorable crystallinity and high performance can be formed. A single crystal semiconductor substrate having an embrittlement layer and a base substrate are bonded with an insulating layer interposed therebetween; the single crystal semiconductor substrate is separated along the embrittlement layer by heat treatment; a single crystal semiconductor layer is fixed to the base substrate; the single crystal semiconductor layer is irradiated with a laser beam; the single crystal semiconductor layer is in a partially melted state to be recrystallized; and crystal defects are repaired. In addition, the energy density of a laser beam with which the best crystallinity of the single crystal semiconductor layer is obtained is detected by a microwave photoconductivity decay method.

6 Claims, 11 Drawing Sheets

U.S. PATENT DOCUMENTS

| | | | |
|---|---|---|---|
| 7,176,108 B2 * | 2/2007 | Cayrefourcq et al. | 438/458 |
| 7,220,660 B2 * | 5/2007 | Im et al. | 438/487 |
| 7,579,654 B2 | 8/2009 | Couillard et al. | |
| 7,700,498 B2 * | 4/2010 | Chou et al. | 438/760 |
| 7,825,007 B2 | 11/2010 | Yamazaki et al. | |
| 7,842,583 B2 | 11/2010 | Tsukamoto et al. | |
| 2003/0193066 A1 * | 10/2003 | Ito et al. | 257/335 |
| 2004/0055999 A1 * | 3/2004 | Chen et al. | 216/57 |
| 2007/0281172 A1 * | 12/2007 | Couillard et al. | 428/446 |
| 2008/0280424 A1 | 11/2008 | Yamazaki et al. | |
| 2009/0090916 A1 | 4/2009 | Yamazaki et al. | |
| 2009/0170286 A1 | 7/2009 | Tsukamoto et al. | |
| 2009/0321747 A1 | 12/2009 | Murphy et al. | |
| 2011/0115046 A1 | 5/2011 | Shimomura et al. | |

FOREIGN PATENT DOCUMENTS

| | | |
|---|---|---|
| JP | 2005-203596 | 7/2005 |
| JP | 2005-252244 A | 9/2005 |

OTHER PUBLICATIONS

Bell. A Beginner's Guide to Uncertainty of Measurment. Issue 2, 2001, No. 11. National Physical Laboratory, pp. 1-32.*

* cited by examiner

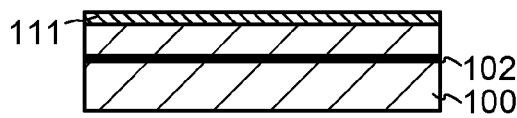
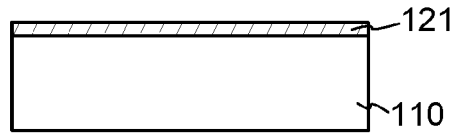
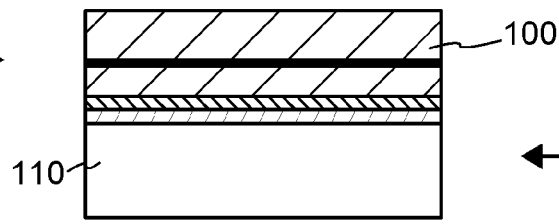
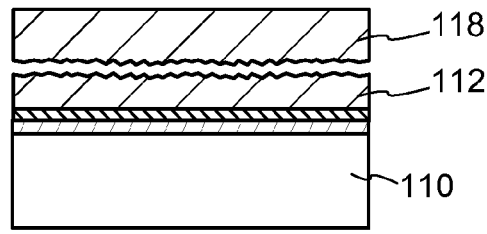
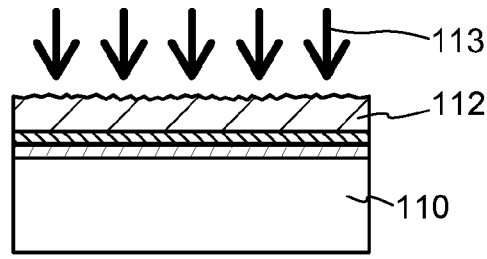
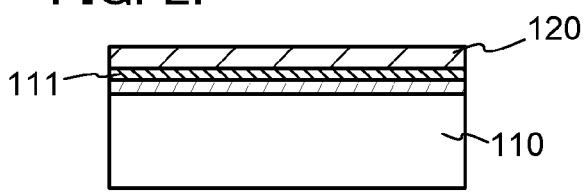

MANUFACTURING METHOD OF SEMICONDUCTOR SUBSTRATE AND SEMICONDUCTOR DEVICE

BACKGROUND OF THE INVENTION

1. Field of the Invention

The present invention relates to a method for manufacturing a semiconductor substrate provided with a single crystal semiconductor layer over a base substrate having an insulating surface. In addition, the present invention relates to a semiconductor device manufactured using the semiconductor substrate.

2. Description of the Related Art

In recent years, an integrated circuit using an SOI (silicon on insulator) substrate in which a thin single crystal semiconductor layer is formed on an insulating surface, instead of a bulk silicon wafer has been developed. By utilizing characteristics of a thin single crystal silicon layer formed over an insulating film, transistors formed in the integrated circuit can be electrically separated from each other completely. Further, each transistor can be formed as a fully-depleted transistor, and thus a semiconductor integrated circuit with high added value such as high integration, high speed driving, and low voltage consumption can be realized.

As a method for manufacturing an SOI substrate, a hydrogen ion implantation separation method in which hydrogen ion implantation and separation are combined is known. A method for manufacturing an SOI substrate using a hydrogen ion implantation separation method is briefly described below. First, by implantation of hydrogen ions into a silicon wafer serving as a substrate for separation by an ion implantation method, an ion-implanted layer is formed at a predetermined depth from the surface. Then, the silicon wafer into which the hydrogen ions are implanted is bonded to another silicon wafer with a silicon oxide film interposed therebetween (bonding). Then, through heat treatment, the ion-implanted layer serves as a cleavage plane and separation into a thin film occurs in the silicon wafer to be separated into which hydrogen ions are implanted. Accordingly, a single crystal silicon film can be formed over the silicon wafer to be separated. The hydrogen ion implantation separation method is also called a Smart Cut (registered trademark) method.

A method in which a single crystal silicon film is formed over a base substrate made of glass by a hydrogen ion implantation separation method has been proposed. For example, in Reference 1, a separation plane is mechanically polished in order to remove a defect layer formed by ion implantation or a step which is several to several tens of nanometers in height in the separation plane. In Reference 2, after a separation process, heat treatment such as irradiating a single crystal semiconductor layer with a laser beam or the like is performed, whereby planarity of the single crystal semiconductor layer is improved. In Reference 3, after a separation process, by irradiation with a laser beam, crystal quality of a semiconductor thin film layer is improved, and the semiconductor thin film layer and a transparent insulating substrate are strongly bonded to each other.

REFERENCES

Reference 1: Japanese Published Patent Application No. H11-097379
Reference 2: Japanese Published Patent Application No. 2000-294754
Reference 3: Japanese Published Patent Application No. 2005-252244

SUMMARY OF THE INVENTION

In the case where a thin single crystal semiconductor layer is formed using a hydrogen ion implantation separation method, planarity of a surface of the single crystal semiconductor layer which is formed is lost because of ion implantation, a physical impact in separation, or the like, and crystal defects are increased. For example, in the case where there are a large number of defects in the single crystal semiconductor layer, a defect level is easily formed at an interface with a gate insulating layer; therefore, characteristics of a semiconductor element formed using this single crystal semiconductor layer is not good. When there is large unevenness on the surface of the single crystal semiconductor layer, it is difficult to form a gate insulating layer with a high withstand voltage, causing a decrease in performance of the semiconductor element such as a decrease in field effect mobility, an increase in a threshold voltage, and the like. Thus, treatment is required to recover crystallinity and planarity of the single crystal semiconductor layer after separation.

As a solution for the above problems, for example, heating at a high temperature (at higher than or equal to 800° C.) or treatment such as grinding and polishing can be given. However, heating at a high temperature or treatment such as grinding and polishing is not appropriate for treatment on a single crystal semiconductor layer formed over a glass substrate. This is because a glass substrate has an upper temperature limit of about 650° C. and has a larger size than a silicon substrate or the like.

In Reference 2 and Reference 3, a method for improving crystallinity or planarity of a single crystal semiconductor layer by irradiating the single crystal semiconductor layer with a laser beam after separation is proposed. However, the present inventors found through their research that, in the case where the irradiation intensity of a laser beam is too low, crystal defects are not sufficiently repaired, while in the case where the irradiation intensity of a laser beam is too high, problems occur in that planarity of a surface is lowered and part of a single crystal semiconductor layer is microcrystallized.

Thus, to achieve improvement of crystallinity and planarization of a single crystal semiconductor layer by laser irradiation treatment, it is necessary to optimize the irradiation intensity of a laser beam used for irradiation. However, energy of a laser beam is very unstable, and even when laser beams are applied under the same settings using the same apparatus, energy of the laser beams varies every time due to apparatus condition. In addition, in accordance with variation in thicknesses of single crystal semiconductor layers which are irradiated with laser beams, the optimum irradiation intensity of a laser beam varies each substrate; therefore, it is not easy to determine the intensity of the laser beam uniformly.

In view of the above-described problems, it is an object of an embodiment of the present invention to manufacture a single crystal semiconductor layer having favorable crystallinity and planarity and a semiconductor substrate including the single crystal semiconductor layer by optimization of irradiation conditions for a laser beam with which the single crystal semiconductor layer fixed to a base substrate is irradiated.

In addition, it is an object of an embodiment of the present invention to provide methods for manufacturing a semiconductor substrate and a semiconductor device by which a high-performance semiconductor element can be formed.

An embodiment of the present invention is to detect energy density of a laser beam with which the best crystallinity of a single crystal semiconductor layer is obtained by a microwave photoconductivity decay method. Specifically, a monitor substrate is irradiated with a laser beam under a plurality of energy density conditions, and the energy density of the laser beam when intensity of a reflected microwave is the maximum in the single crystal semiconductor layer of the monitor substrate after irradiation with the laser beam is detected. Next, with optimum energy density in consideration of variation in thicknesses of the single crystal semiconductor layers of each substrate and variation of irradiation of a laser, single crystal semiconductor layers are irradiated with their respective laser beams, and semiconductor substrates are manufactured. The details are as follows.

According an embodiment of the present invention, a method for manufacturing a semiconductor substrate includes the following steps of: irradiating surfaces of each of first to n-th ($n \geq 2$) single crystal semiconductor substrates with ions; forming embrittlement layers at a predetermined depth from the surfaces of each of the first to n-th single crystal semiconductor substrates; bonding the first to n-th single crystal semiconductor substrates to first to n-th base substrates, respectively with insulating layers provided on at least one of the single crystal semiconductor substrates and the base substrates interposed therebetween. Next, first to n-th single crystal semiconductor layers are fixed to the first to n-th base substrates by separation of the first to n-th single crystal semiconductor substrates, respectively along their respective embrittlement layers by heat treatment. Next, when the first single crystal semiconductor layer is irradiated with a laser beam under a plurality of energy density conditions, a peak value of a detection signal of a reflected microwave of the first single crystal semiconductor layer is detected by a microwave photoconductivity decay method, and energy density of the laser beams when the peak value is the maximum is expressed by $E1_{max}$, the second to n-th single crystal semiconductor layers are irradiated with their respective laser beams whose energy density E satisfies the following Formula 1.

$$0.90 E1_{max} + 3.9\sigma \leq E \leq E1_{max} - 3.9\sigma \qquad \text{[Formula 1]}$$

(Note that in Formula 1, σ satisfies the following Formula 2.)

$$\sigma = \sqrt{\sigma_t^2 + \sigma_e^2} \qquad \text{[Formula 2]}$$

(Note that in Formula 2, $\sigma_t$ represents a standard deviation of the energy density when the intensity of a reflected microwave is the maximum in each of n pieces of the single crystal semiconductor layers, and $\sigma_e$ represents a standard deviation of the energy density of each laser beam with which semiconductor substrates are irradiated.)

Alternatively, in the method for manufacturing a semiconductor substrate according to an embodiment of the present invention, when the thickness of the first single crystal semiconductor layer is the median of that of the first to n-th single crystal semiconductor layers or is the closest to the median of thicknesses of n pieces of the single crystal semiconductor layers, and the energy density of a laser beam whose peak value is the maximum is expressed by the $E1_{max}$, the second to n-th single crystal semiconductor layers are irradiated with laser beams whose energy density E satisfies the following Formula 3.

$$0.90 E1_{max} + 3.9\sigma \leq E \leq E1_{max} - 3.9\sigma \qquad \text{[Formula 3]}$$

(Note that in Formula 3, σ Satisfies the Following Formula 4.)

$$\sigma = \sqrt{(2.87\sigma_d)^2 + \sigma_e^2} \qquad \text{[Formula 4]}$$

(Note that in Formula 4, $\sigma_d$ represents a standard deviation of thicknesses of n pieces of the single crystal semiconductor layers, and $\sigma_e$ represents a standard deviation of the energy density of the laser beams for irradiation.)

Note that in this specification, a bonding layer can be formed not only on the surface of the single crystal semiconductor substrate but also on the surface of the base substrate. Alternatively, the bonding layer can be formed only on the surface of the base substrate.

In this specification, a "silicon oxynitride film" means a film that contains more oxygen than nitrogen and, in the case where measurements are performed using Rutherford backscattering spectrometry (RBS) and hydrogen forward scattering (HFS), includes oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, a "silicon nitride oxide film" means a film that contains more nitrogen than oxygen and, in the case where measurements are performed using RBS and HFS, includes oxygen, nitrogen, silicon, and hydrogen at composition ranging from 5 at. % to 30 at. %, 20 at. % to 50 at. %, 25 at. % to 35 at. %, and 15 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

With the use of an embodiment of the present invention, regardless of variation of a laser and variation in thicknesses of single crystal semiconductor layers, the irradiation intensity of a laser beam to be emitted to the single crystal semiconductor layers can be optimized. Therefore, a single crystal semiconductor layer having favorable crystallinity and planarity can be manufactured efficiently.

A high-performance semiconductor element can be efficiently formed using a semiconductor substrate which is an embodiment of the present invention.

BRIEF DESCRIPTION OF THE DRAWINGS

FIGS. 2A to 2F are diagrams illustrating a manufacturing process of a semiconductor substrate.

DETAILED DESCRIPTION OF THE INVENTION

Embodiments and Examples according to the present invention will hereinafter be described. It is easily understood by those skilled in the art that the present invention can be carried out in many different modes, and modes and details disclosed herein can be modified in various ways without departing from the spirit and scope of the present invention. Therefore, the present invention is not construed as being limited to the description of the Embodiments and the Examples. Further, the same portions are denoted by the same reference symbols through the drawings, and repetition description of materials, shapes, manufacturing methods, and the like is omitted.

Embodiment 1

In this embodiment, a laser irradiation process of a single crystal semiconductor layer in a method for manufacturing a semiconductor substrate will be described.

Figure 1:
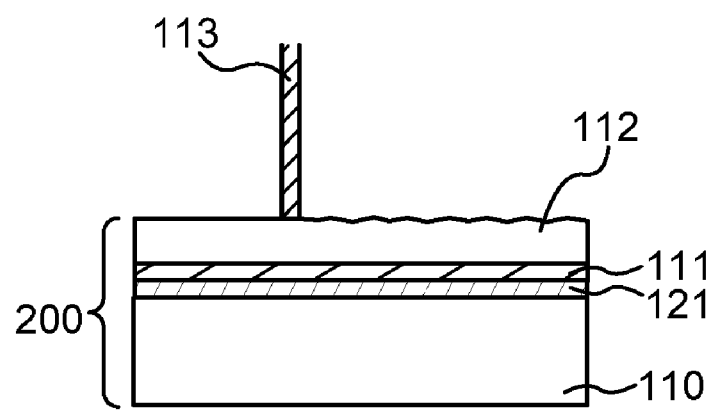
FIG. 1 is a diagram illustrating an example of a laser irradiation process.

FIG. 1 illustrates a process in which a single crystal semiconductor layer 112 is irradiated with a laser beam 113. In FIG. 1, as for a semiconductor substrate 200 of this embodiment, the single crystal semiconductor layer 112 separated from a single crystal semiconductor substrate is provided over a base substrate 110 with a first insulating layer 111 and a second insulating layer 121 interposed therebetween. As described above, planarity of a surface of the single crystal semiconductor layer 112 which has been separated from the single crystal semiconductor substrate is lost because of ion introduction, a physical impact in separation, or the like. Note that as the single crystal semiconductor substrate, a single crystal silicon substrate, a germanium substrate, or a compound semiconductor substrate of gallium arsenide, indium phosphide, or the like can be used. In this embodiment, as the single crystal semiconductor substrate, a single crystal silicon substrate is used.

When the single crystal semiconductor layer 112 is irradiated with the laser beam 113, the single crystal semiconductor layer 112 absorbs the laser beam 113, and the temperature of a portion irradiated with the laser beam 113 is increased. When the temperature of this portion is higher than or equal to the melting point of the single crystal semiconductor layer 112, the single crystal semiconductor layer 112 is melted, and defects can be repaired. After irradiation with the laser beam 113 is stopped, the temperature of a melted portion of the single crystal semiconductor layer 112 is decreased, and the melted portion is solidified and recrystallized (re-single-crystallized) before long. Accordingly, the planarity of the single crystal semiconductor layer is improved, and crystallinity can be recovered. By using a laser beam, the base substrate 110 is not directly heated, and the temperature rise of the base substrate 110 can be suppressed.

Note that it is preferable that the single crystal semiconductor layer 112 be partially melted by the laser irradiation. When the single crystal semiconductor layer 112 is in a partially melted state by being irradiated with the laser beam 113, planarization proceeds due to surface tension of a semiconductor that is changed into a liquid phase. At the same time, cooling of the single crystal semiconductor layer 112 advances due to thermal diffusion to the base substrate 110. In the single crystal semiconductor layer 112, temperature gradient is generated in the depth direction. The solid-liquid interface is moved from the base substrate 110 side to the surface of the single crystal semiconductor layer 112, and recrystallization which is a so-called longitudinal growth occurs. This recrystallization is advanced using as a seed a lower region which is not melted. The lower solid-phase portion is single crystal and has uniform crystal orientation; thus, no crystal grain boundary is formed therein and the single crystal semiconductor layer 112 after laser irradiation process can be a single crystal semiconductor layer without any crystal grain boundary. The upper melted portion is recrystallized by being solidified, and a single crystal semiconductor which has the same crystal orientation as the single crystal semiconductor in the lower portion which remains in a solid phase is formed.

In the case where the single crystal semiconductor layer 112 is in a completely melted state, part of a region of the single crystal semiconductor layer is microcrystallized and crystallinity is reduced because of disordered nucleation of the single crystal semiconductor layer in a liquid phase. Note that the term "complete melting" here means that the single crystal semiconductor layer 112 is melted to the vicinity of the lower interface to be made in a liquid phase. On the other hand, the term "partial melting" means that the upper part of the single crystal semiconductor layer 112 is melted to be made in a liquid phase while the lower part thereof is not melted and is still in a solid phase.

Irradiation conditions of a laser beam can be determined by evaluation of crystallinity using a microwave photoconductivity decay method (hereinafter referred to as μ-PCD method).

A μ-PCD method is a method for evaluating a lifetime in the following manner. A surface of a semiconductor is irradiated with a laser beam to generate carriers in the semiconductor, a portion irradiated with the laser beam in the semiconductor is irradiated with a microwave, and a state of intensity decay of the microwave reflected by the semiconductor is detected. A μ-PCD method utilizes the phenomenon that since the resistance value of a semiconductor is decreased when carriers are generated in the semiconductor, the reflectivity of a microwave is increased in a region of the semiconductor where carriers are generated. Accordingly, in a μ-PCD method, the lifetime is evaluated by detecting the intensity of the reflected microwave. It is known that, in the case where a semiconductor is a thin film, the lifetime can be evaluated using a peak value of a detection signal of a reflected microwave (hereinafter referred to as a peak value), and the higher the peak value is, the longer the lifetime is.

Upon irradiation of single crystal silicon with light, electrons generated in a valence band and holes generated in a conduction band are recombined and annihilated. When a single crystal silicon layer has a large number of contaminated portions or defects, the density of the charge trap center becomes high. Thus, the probability of the recombination of carriers in single crystal silicon becomes high; accordingly, the lifetime is shortened. Therefore, the lifetime is used as a parameter to evaluate whether a crystal structure of a semiconductor such as single crystal silicon is completed, and the longer the lifetime is (that is, the higher the peak value is), the more favorable the crystallinity is.

In the case of laser energy with which the single crystal semiconductor layer is in a partially melted state, as the energy density is high, the single crystal semiconductor layer is in a liquid state and a region where a defect is repaired expands; therefore, a peak value increases. On the other hand, when laser energy becomes excessive and the single crystal semiconductor layer is in a completely melted state, the single crystal semiconductor layer after recrystallization is microcrystallized; therefore, crystallinity is reduced and a peak value is reduced.

Figure 12:
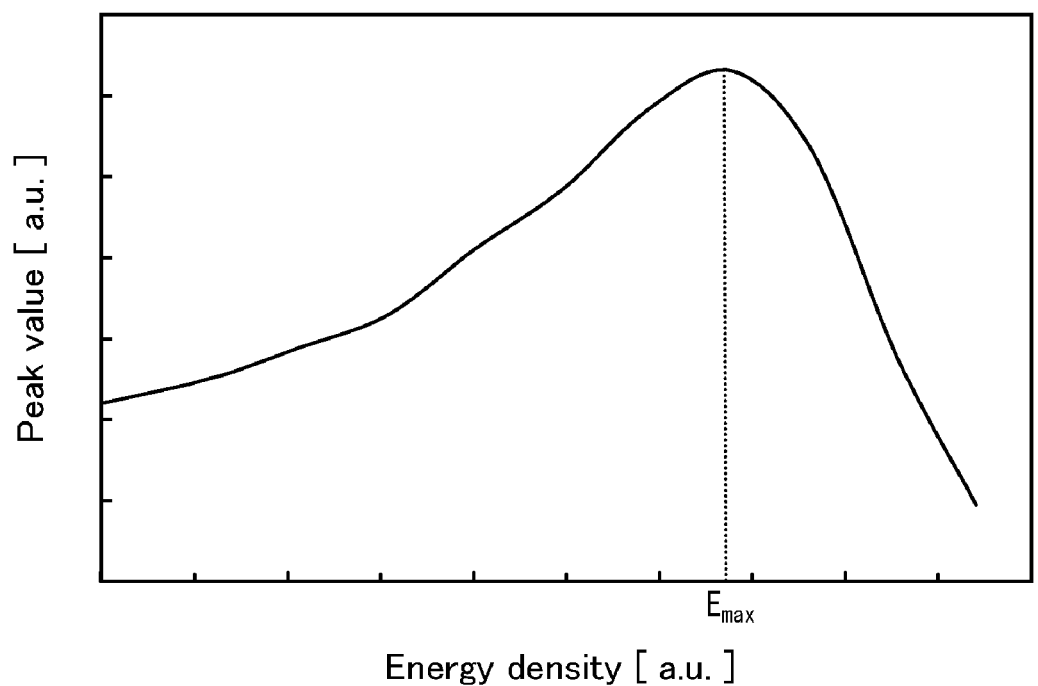
FIG. 12 is a model diagram illustrating correlations between energy density and a peak value.

In FIG. 12, a relation between the energy density of a laser beam to be emitted and a peak value detected in the single crystal semiconductor layer after laser irradiation is schematically illustrated. In FIG. 12, the vertical axis represents a peak value detected in the single crystal semiconductor layer, while the horizontal axis represents the energy density of a laser beam. As illustrated in FIG. 12, the peak values detected in the single crystal semiconductor layer have a maximum value. In a region that is irradiated with a laser beam having lower than or equal to an energy density whose peak value is the maximum, the single crystal semiconductor layer is in a partially melted state, and the single crystal semiconductor layer irradiated with a laser beam which exceeds the energy density is microcrystallized. Therefore, the energy density whose peak value is the maximum (hereinafter referred to as $E_{max}$) is the highest energy density with which the single crystal semiconductor layer is partially melted and is optimum energy density with which the number of crystal defects of the single crystal semiconductor layer is minimized.

Note that there is a correlation between the thickness of the single crystal semiconductor layer and the $E_{max}$, and when the thickness of the single crystal semiconductor layer is increased, the $E_{max}$ is also increased.

As described above, the energy density whose peak value is the maximum is calculated using a μ-PCD method, whereby the energy density of laser irradiation by which crystallinity is favorable can be determined by a simple method without damage.

In the case where n pieces of single crystal semiconductor layers are subjected to laser treatment and n pieces of semiconductor substrates are formed, one of n pieces of the semiconductor substrates is used as a monitor substrate, and a plurality of regions of the single crystal semiconductor layer of the monitor substrate is irradiated with a laser beam under a plurality of energy density conditions which are different from each other, and then an optimum irradiation condition is determined by detection of the $E_{max}$ using a μ-PCD method. Then, (n−1) pieces of the semiconductor substrates are irradiated with their respective laser beams under the optimal irradiation condition. However, energy of the laser beams is very unstable, and even when laser beams are applied under the same settings using the same apparatus, the energy density of the laser beams that are emitted varies due to apparatus conditions. Since the $E_{max}$ depends on the thicknesses of the single crystal semiconductor layers, the optimum irradiation intensity of the laser beams varies each substrate due to variation in thicknesses of the single crystal semiconductor layers which are irradiated with their respective laser beams. Therefore, for example, in the case where the thickness of the single crystal semiconductor layer provided in the n-th semiconductor substrate (hereinafter referred to as a single crystal semiconductor layer N) is smaller than the thickness of the single crystal semiconductor layer of the monitor substrate (hereinafter referred to as a single crystal semiconductor layer M), when the single crystal semiconductor layer N is irradiated with a laser beam at the $E_{max}$ (hereinafter also referred to as $E1_{max}$) of the single crystal semiconductor layer M, excessive laser energy is provided and the single crystal semiconductor layer N is microcrystallized. Since the microcrystallization of the single crystal semiconductor layer is irreversible, the n-th semiconductor substrate which is microcrystallized is a defective substrate.

Accordingly, when (n−1) pieces of the substrates are irradiated with their respective laser beams, the energy density which is lower than the $E1_{max}$ is required to be selected in consideration of variation in thickness. As an index by which the energy density to be selected and a defect rate to be generated are evaluated, there is a process capability index Cpk. The process capability index means that a quality management capability having a process is converted into numbers in the process, and as the value is high, the process control capability is high; therefore, process control is possible in accordance with the value. When the lower specification limit, the upper specification limit, the mean value, and the standard deviation of the energy density of a laser beam are expressed by LSL, USL, xbar, and σ, respectively, the lower process capability index and the upper process capability index are expressed by the flowing Formula 5 and the following Formula 6, respectively.

$$Cpk = \frac{xbar - LSL}{3\sigma} \quad \text{[Formula 5]}$$

$$Cpk = \frac{USL - xbar}{3\sigma} \quad \text{[Formula 6]}$$

In this embodiment, LSL is the minimum energy density with which the single crystal semiconductor layer M is melted. In addition, xbar is expressed by the energy density E with which (n−1) pieces of the semiconductor substrates are irradiated, σ is a value of the sum of a standard deviation of the $E_{max}$ in each of n pieces of the single crystal semiconductor layers and a standard deviation of the energy density of each laser beam with which n pieces of the semiconductor substrates are irradiated. Regarding the energy density which is lower than or equal to the $E_{max}$, as the energy density with which the single crystal semiconductor layer M is melted is high, the crystallinity of the single crystal semiconductor layer M is improved. Therefore, to obtain sufficient crystallinity, the lower specification limit is preferably greater than or equal to 90% of the $E_{max}$, more preferably, greater than or equal to 95%. Accordingly, the lower limit of the process capability index Cpk is preferably expressed by the following Formula 7, more preferably, the following Formula 8.

$$Cpk = \frac{0.90E_{max} - E}{3\sigma} \quad \text{[Formula 7]}$$

$$Cpk = \frac{0.95E_{max} - E}{3\sigma} \quad \text{[Formula 8]}$$

Note that in Formula 7 and Formula 8, σ is a standard deviation of the sum of a standard deviation $\sigma_t$ of the $E_{max}$ in each of n pieces of the single crystal semiconductor layers and a standard deviation $\sigma_e$ of the energy density of each laser beam with which n pieces of the semiconductor substrates are irradiated, and σ satisfies the following Formula 9.

$$\sigma = \sqrt{\sigma_t^2 + \sigma_e^2} \quad \text{[Formula 9]}$$

In this embodiment, USL is the $E1_{max}$, and xbar is expressed by the energy density E with which (n−1) pieces of the semiconductor substrates are irradiated. When σ is a value of the sum of a standard deviation of the $E_{max}$ in each of n pieces of the single crystal semiconductor layers and a standard deviation of the energy density of each laser beam with which n pieces of the semiconductor substrates are irradiated, the upper limit of the process capability index Cpk is expressed by the following Formula 10.

$$Cpk = \frac{E_{max} - E}{3\sigma} \quad \text{[Formula 10]}$$

Note that in Formula 10, σ is a standard deviation of the sum of a standard deviation $\sigma_t$ of the $E_{max}$ in each of n pieces of the single crystal semiconductor layers and a standard deviation $\sigma_e$ of the energy density of each laser beam with which n pieces of the semiconductor substrates are irradiated, and σ satisfies the following Formula 11.

$$\sigma = \sqrt{\sigma_t^2 + \sigma_e^2} \quad \text{[Formula 11]}$$

The relation between the process capability index and the rate of occurrence of defective substrates is illustrated in Table 1.

TABLE 1

| process capability index Cpk | percent defective |
| --- | --- |
| 0.00 | 50% |
| 0.65 | 2.60% |
| 1.30 | 50 ppm |
| 1.95 | 2.7 ppb |

From Table 1, when Cpk is 1.3, the percent defective can be reduced to 50 ppm; therefore, it is preferable that Cpk be greater than or equal to 1.3 to stably perform laser treatment. Therefore, when the energy density whose peak value detected in the single crystal semiconductor layer M is the maximum is expressed by the $E1_{max}$, the energy density E of each laser beam with which (n−1) pieces of the semiconductor substrates are irradiated preferably satisfies the following Formula 12.

$$0.90 E1_{max} + 3.9\sigma \leq E \leq E1_{max} - 3.9\sigma \quad \text{[Formula 12]}$$

When the energy density when the peak value detected in the single crystal semiconductor layer M is the maximum is expressed by the $E1_{max}$, the energy density E of each laser beam with which (n−1) pieces of the semiconductor substrates are irradiated preferably satisfies the following Formula 13.

$$0.90 E1_{max} + 3.9\sigma \leq E \leq E1_{max} - 3.9\sigma \quad \text{[Formula 13]}$$

Note that in Formula 12 and Formula 13, σ satisfies the following Formula 14.

$$\sigma = \sqrt{\sigma_t^2 + \sigma_e^2} \quad \text{[Formula 14]}$$

In Formula 14, $\sigma_t$ represents a standard deviation of the energy density when the intensity of a reflected microwave is the maximum in each of n pieces of the single crystal semiconductor layers, and $\sigma_e$ represents a standard deviation of the energy density of each laser beam with which the semiconductor substrates are irradiated.

As described above, the energy density whose the peak value is the maximum is calculated using a μ-PCD method, whereby optimum energy density of laser irradiation on the single crystal semiconductor layer can be selected by a simple method without damage. Accordingly, a semiconductor substrate including a single crystal semiconductor layer with favorable planarity and crystallinity can be efficiently manufactured.

The energy density E which is selected is selected in consideration of variation in thicknesses of the single crystal semiconductor layers of each semiconductor substrate and variation of energy of a laser; accordingly, generation of a defective substrate can be suppressed in a manufacturing process of the semiconductor substrates. Therefore, a semiconductor substrate including a favorable single crystal semiconductor layer can be manufactured at low cost.

Note that this embodiment can be freely combined with any of the other embodiments.

Embodiment 2

In this embodiment, a method for manufacturing a semiconductor substrate using the method for detecting an optimal condition for a laser beam described in Embodiment 1 will be described with reference to FIGS. 2A to 2F.

First, a single crystal semiconductor substrate 100 is prepared. As the single crystal semiconductor substrate 100, for example, a single crystal semiconductor substrate formed with an element belonging to Group 14 of the periodic table, such as silicon, germanium, silicon germanium, or silicon carbide can be used. Needless to say, a substrate made of a compound semiconductor such as gallium arsenide or indium phosphide may be used. In this embodiment, as the single crystal semiconductor substrate 100, a single crystal silicon substrate is used. Although there is no limitation on the shape and the size of the single crystal semiconductor substrate 100, for example, it is possible to process a circular semiconductor substrate of 8 inches (200 mm) in diameter, 12 inches (300 mm) in diameter, 18 inches (450 mm) in diameter or the like, into a rectangle and to use the processed substrate. Note that in this specification, a "single crystal" has certain regularity in its crystal structure and crystal axes are oriented in the same direction in any portion. That is, the single crystal semiconductor substrate may have a few defects. In addition, the term "rectangle" also includes a square.

After the single crystal semiconductor substrate 100 is cleaned, the first insulating layer 111 is formed over a surface of the single crystal semiconductor substrate 100. For example, heat treatment is performed on the single crystal semiconductor substrate 100 under an oxidizing atmosphere, whereby the first insulating layer 111 can be formed. As thermal oxidation treatment, oxidation in an oxidizing atmosphere to which halogen (for example, chlorine or fluorine) is added is preferably performed. Halogen is included in the insulating layer formed by performing thermal oxidation in which halogen is added, and when halogen is included at a concentration of greater than or equal to $1 \times 10^{16}$ atoms/cm$^3$ and less than or equal to $2 \times 10^{21}$ atoms/cm$^3$, the insulating layer can function as a protective film which captures an impurity such as metal and prevents the single crystal semiconductor substrate 100 from being contaminated.

In this embodiment, thermal oxidation treatment is performed under an atmosphere including HCl at 3 volume % with respect to oxygen, and a silicon oxide film including chlorine is formed as the first insulating layer 111. The temperature of the thermal oxidation treatment is set to be 950° C. and the thickness of the first insulating layer 111 is set to be 50 nm Note that the first insulating layer 111 has a single-layer structure in this embodiment; however, it may have a stacked structure of two or more layers.

Next, the single crystal semiconductor substrate 100 is irradiated with an ion beam formed of ions accelerated by an electric field, through the first insulating layer 111, and an embrittlement layer 102 is formed in a region at a predetermined depth from the surface of the single crystal semiconductor substrate 100 (FIG. 2A). The depth of the region where the embrittlement layer 102 is formed can be controlled by the accelerating energy of the ion beam and the incidence angle thereof. Here, the embrittlement layer 102 is formed in a region at a depth the same or substantially the same as the average depth at which the ions have entered.

The thickness of the semiconductor layer which is separated from the single crystal semiconductor substrate 100 is determined depending on the depth at which the embrittlement layer 102 is formed. The depth at which the embrittlement layer 102 is formed is greater than or equal to 50 nm and less than or equal to 500 nm, preferably greater than or equal to 50 nm and less than or equal to 200 nm, from the surface of the single crystal semiconductor substrate 100.

When the single crystal semiconductor substrate 100 is irradiated with ions, an ion implantation apparatus or an ion doping apparatus can be used. In an ion implantation apparatus, a source gas is excited to produce ion species, the produced ion species are mass-separated, and ion species each having a predetermined mass is implanted in a process object. In the ion doping apparatus, a process gas is excited to produce ion species, the produced ion species are not mass-separated, and a process object is irradiated with the produced ion species. In an ion doping apparatus provided with a mass separator, ion implantation with mass separation can be performed similarly to the ion implantation apparatus. In this specification, the use of one of an ion implantation apparatus and an ion doping apparatus is specified only in the case where one of them needs to be used, whereas in the case where there is not specific description, either of them may be used to perform ion irradiation.

An ion irradiation step in the case of using an ion doping apparatus can be performed under the following conditions, for example.

Acceleration voltage is greater than or equal to 10 kV and less than or equal to 100 kV (preferably greater than or equal to 30 kV and less than or equal to 80 kV)

Dose is greater than or equal to $1 \times 10^{16}$ ions/cm$^2$ and less than or equal to $4 \times 10^{16}$ ions/cm$^2$ Beam current density is higher than or equal to 2 µA/cm$^2$ (preferably, higher than or equal to 5 µA/cm$^2$, and more preferably, higher than or equal to 10 µA/cm$^2$)

In the case of using an ion doping apparatus, a gas containing hydrogen can be used as a source gas for an ion irradiation step. With the gas containing hydrogen, $H^+$, $H_2^+$, and $H_3^+$ can be produced as ion species. In the case where the gas containing hydrogen is used as a source gas, it is preferable that irradiation with a large amount of $H_3^+$ be performed. Specifically, the proportion of $H_3^+$ ions which are included in the ion beam is preferably greater than or equal to 70% with respect to the total amount of $H^+$, $H_2^+$, and $H_3^+$; more preferably, the proportion of $H_3^+$ ions is greater than or equal to 80%. By increasing the proportion of $H_3^+$, the embrittlement layer 102 can contain hydrogen at a concentration of greater than or equal to $1 \times 10^{20}$ atoms/cm$^3$. Thus, separation from the embrittlement layer 102 becomes easier. By irradiation with a larger amount of $H_3^+$ ions, ion irradiation efficiency is improved compared to the case of irradiation with $H^+$ ions and $H_2^+$ ions. In other words, time required for ion irradiation can be shortened.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. Heavy metal might be introduced at the same time when an ion doping apparatus is used; thus, ion irradiation is performed through the first insulating layer 111 including chlorine atoms in this embodiment, whereby the single crystal semiconductor substrate 100 can be prevented from being contaminated due to the heavy metal.

When the ion implantation apparatus is used, it is preferable to implant $H_3^+$ ions through mass separation. Of course, $H_2^+$ ions may be implanted. Note that, in the case of using an ion implantation apparatus, ion irradiation efficiency may be reduced compared to the case of using an ion doping apparatus. This is because ion species are selectively implanted.

Although the first insulating layer 111 may be formed after ion irradiation, it is preferable to provide the first insulating layer 111 before ion irradiation in order to prevent contamination and surface damage of the single crystal semiconductor substrate 100 at the time of ion irradiation. When the first insulating layer 111 is damaged at the time of ion irradiation, the first insulating layer 111 may be removed after the embrittlement layer 102 is formed, and another insulating layer may be formed.

Next, the base substrate 110 is prepared. As the base substrate 110, a substrate formed of an insulator is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. In this embodiment, the case of using a glass substrate is described. Cost reduction can be achieved when a glass substrate which can have a larger size and is inexpensive is used as the base substrate 110 as compared to when a silicon wafer is used.

The surface of the base substrate 110 is preferably cleaned in advance. Specifically, ultrasonic cleaning is performed on the base substrate 110 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 110 using a hydrochloric acid/hydrogen peroxide mixture. Through such cleaning treatment, the surface of the base substrate 110 can be planarized and abrasive particles left on the surface of the base substrate 110 can be removed.

Next, the second insulating layer 121 is formed over a surface of the base substrate 110 (FIG. 2B). The second insulating layer 121 may have either a single-layer structure or a stacked structure. In addition, the second insulating layer 121 is not necessarily formed. As a material for forming the second insulating layer 121, silicon oxide, silicon nitride, silicon oxynitride, silicon nitride oxide, or the like can be used. In this embodiment, a nitrogen-containing layer (for example, an insulating film including nitrogen such as a silicon nitride film ($SiN_x$) or a silicon nitride oxide film ($SiN_xO_y$) (x>y)) is formed as the second insulating layer 121.

In this embodiment, a nitrogen-containing layer which functions as the second insulating layer 121 serves as a layer (bonding layer) which is bonded to the first insulating layer 111 provided over the single crystal semiconductor substrate 100. In addition, when a semiconductor layer having a single crystal structure (hereinafter referred to as a "single crystal semiconductor layer") is provided over the base substrate later, the nitrogen-containing layer also functions as a barrier layer for preventing impurities such as Na (sodium) contained in the base substrate from diffusing into the single crystal semiconductor layer.

Then, the above-described base substrate 110 and the single crystal semiconductor substrate 100 are bonded to each other (FIG. 2C). Specifically, after cleaning the surfaces of the base substrate 110 and the single crystal semiconductor substrate 100 by a method such as ultrasonic cleaning, the surface of the base substrate 110 and the surface of the single crystal semiconductor substrate 100 are disposed to be in contact with each other. Then, pressure treatment is performed so that the surface of the base substrate 110 and the surface of the single crystal semiconductor substrate 100 are bonded to each other (formation of bonding). Van der Waals force and hydrogen bonding seem to act on this formation of bonding.

Before the bonding step, the surface of the base substrate 110 or the surface of the single crystal semiconductor substrate 100 may be subjected to oxygen plasma treatment or ozone treatment so as to be hydrophilic. By this treatment, a hydroxyl is added to the surface of the base substrate 110 or the surface of the single crystal semiconductor substrate 100, so that a hydrogen bond can be formed efficiently.

Next, heat treatment is performed on the base substrate 110 and the single crystal semiconductor substrate 100 which are bonded to each other, so that bonding becomes stronger. At this time, it is necessary that the heating temperature be a temperature at which separation at the embrittlement layer 102 is not advanced. For example, a temperature lower than 400° C., more preferably lower than or equal to 300° C. can be employed. There is no particular limitation on heat treatment time, and an optimal condition may be set as appropriate in accordance with a relationship between processing speed and bonding force. In this embodiment, heat treatment is performed at 200° C. for two hours. Here, only a region for bonding may be irradiated with a microwave so that the region can be locally heated. Note that in the case where there is no problem with bonding force, the above-described heat treatment may be omitted.

Next, the single crystal semiconductor substrate 100 is separated into the single crystal semiconductor layer 112 and a single crystal semiconductor substrate 118 along the embrittlement layer 102 (FIG. 2D). The single crystal semiconductor substrate 100 is separated by heat treatment. The temperature of the heat treatment can be set based on the upper temperature limit of the base substrate 110. For example, when a glass substrate is used as the base substrate 110, the temperature of the heat treatment is preferably higher than or equal to 400° C. and lower than or equal to 650° C. However, if heat treatment is performed in a short period of time, the temperature of the heat treatment may be higher than or equal to 400° C. and lower than or equal to 700° C. Note that in this embodiment, heat treatment is performed at 600° C. for two hours.

By performing the heat treatment as described above, volume change of microvoids formed in the embrittlement layer 102 occurs, whereby a crack in the embrittlement layer 102 is generated. As a result, the single crystal semiconductor substrate 100 is cleaved along the embrittlement layer 102. Since the first insulating layer 111 is bonded to the second insulating layer 121 over the base substrate 110, the single crystal semiconductor layer 112 separated from the single crystal semiconductor substrate 100 is fixed to the base substrate 110. Further, since an interface for bonding the base substrate 110 to the single crystal semiconductor substrate 100 is heated by this heat treatment, covalent bonding is formed at the interface for bonding so that the bonding force between the base substrate 110 and the single crystal semiconductor substrate 100 is further improved.

Then, the single crystal semiconductor layer 112 is irradiated with the laser beam 113 for recrystallization, planarization, and the like of the single crystal semiconductor layer 112 (FIG. 2E). Here, by using the method for detecting an optimal condition for the laser beam according to an embodiment of the present invention described in Embodiment 1, the single crystal semiconductor layer 112 can be efficiently recrystallized and planarized.

A pulsed laser is preferably used for irradiation with the laser beam 113. This is because a high-energy pulsed laser beam can be emitted instantaneously and the partially melted state can be easily obtained. The repetition rate is preferably about greater than or equal to 1 Hz and less than or equal to 10 MHz, more preferably greater than or equal to 10 Hz and less than or equal to 1 MHz. As examples of the above-described pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like can be given. Note that the pulsed laser is preferably used for irradiation with the laser beam 113, but an embodiment of the present invention should not be construed as being limited thereto. That is, the use of continuous wave lasers is not excluded. Note that as examples of continuous wave lasers, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like can be given.

The wavelength of the laser beam 113 needs to be a wavelength which is absorbed by the single crystal semiconductor layer 112. The wavelength may be determined in consideration of the penetration depth of the laser beam or the like. For example, in the case where the single crystal semiconductor layer 112 is a single crystal silicon layer, the wavelength can be in the range of greater than or equal to 200 nm and less than or equal to 700 nm Further, the energy density of the laser beam 113 can be determined in consideration of the wavelength of the laser beam 113, the material of the single crystal semiconductor layer 112, the thickness of the single crystal semiconductor layer 112, or the like. Specifically, optimum conditions of the energy density of the laser beam which is emitted can be set by the method described in Embodiment 1, for example, in the range of greater than or equal to 300 $mJ/cm^2$ and less than or equal to 800 $mJ/cm^2$.

The irradiation with the laser beam 113 can be performed in an atmosphere containing oxygen such as an air atmosphere or an inert atmosphere such as a nitrogen atmosphere. In order to perform the irradiation with the laser beam 113 in an inert atmosphere, irradiation with the laser beam 113 may be performed in an airtight chamber while the atmosphere in the chamber may be controlled. In the case where the chamber is not used, a nitrogen atmosphere can be formed by blowing an inert gas such as a nitrogen gas to the surface which is irradiated with the laser beam 113. In addition, the irradiation with the laser beam 113 may be performed in vacuum.

After the irradiation with the laser beam 113 is performed as described above, a thinning process in which the thickness of the single crystal semiconductor layer 112 is reduced may be performed. The thickness of the single crystal semiconductor layer 112 can be determined in accordance with characteristics of an element to be formed with the single crystal semiconductor layer 112. When an active layer or gate insulating layer of a semiconductor element is thinned, suppression of a short channel effect, improvement in mobility, and improvement in subthreshold swing (S value) can be achieved. In order to form a thin gate insulating layer with excellent step coverage over the surface of the single crystal semiconductor layer 112 which is bonded to the base substrate 110, the thickness of the single crystal semiconductor layer 112 is preferably less than or equal to 50 nm and may be greater than or equal to 5 nm and less than or equal to 50 nm.

In order to thin the single crystal semiconductor layer 112, one of dry etching and wet etching or a combination of both of the etchings (etch-back treatment) may be employed. In a dry etching method, a chloride gas such as boron chloride, silicon chloride, or carbon tetrachloride, a chlorine gas, a fluoride gas such as sulfur fluoride or nitrogen fluoride, an oxygen gas, or the like can be used as an etching gas. An example of an etching solution that can be used in a wet etching method is a tetramethylammonium hydroxide (abbreviation: TMAH) solution.

Note that in this embodiment, an example is described in which etching treatment is performed after irradiation with the laser beam; however, an embodiment of the present invention should not be construed as being limited thereto. For example, etching treatment may be performed before irradiation with the laser beam. In this case, unevenness or defects of the surface of the semiconductor layer can be reduced to some extent by the etching treatment, and the embrittlement layer which remains on a separation plane can be removed. By removal of the embrittlement layer, a surface planarization effect and a crystallinity recovery effect produced by laser irradiation can be enhanced. Alternatively, the etching treatment may be performed both before and after irradiation with the laser beam. Further alternatively, the laser irradiation and the etching treatment may be alternately repeated. By using the laser irradiation and the etching treatment in combination as just described, unevenness, defects, and the like of the surface of the semiconductor layer can be significantly reduced. Needless to say, it is not necessary that the above-described etching treatment, heat treatment, or the like is always performed.

After the irradiation with the laser beam, it is preferable that heat treatment for heating at a temperature at which the single crystal semiconductor layer is not melted be performed. For the heat treatment, a diffusion furnace, a heating furnace such as a resistance heating furnace, an RTA apparatus, a microwave heating apparatus, or the like can be used. The heating temperature is a temperature at which the single crystal semiconductor layer 112 is not melted and which is lower than or equal to the strain point of the base substrate 110. The heating temperature is preferably higher than or equal to 500° C.; for example, the heating temperature can be higher than or equal to 500° C. and lower than or equal to 650° C. More preferably, the single crystal semiconductor layer 112 is heated at a temperature of higher than or equal to 550° C.

An atmosphere of the heat treatment can be an inert gas atmosphere. An inert gas refers to a gas of a molecule or an atom which does not form an oxide film by reaction with a surface of the single crystal semiconductor layer in this heat treatment. Examples of inert gases include a nitrogen gas ($N_2$ gas), noble gases such as argon and xenon, and the like. Further, the oxygen concentration in an inert gas atmosphere is preferably lower than or equal to 30 ppm, more preferably lower than or equal to 10 ppm. Furthermore, by setting an atmosphere of the heat treatment to a low-pressure state (vacuum state), oxidation of the surface of the single crystal semiconductor layer can be prevented. The pressure is preferably $1\times10^{-3}$ Pa to $5\times10^{-3}$ Pa.

Accordingly, a semiconductor substrate including a single crystal semiconductor layer 120 (single crystal silicon semiconductor layer) in which the planarity of the surface is improved and the defects are reduced can be manufactured (FIG. 2F).

This embodiment can be implemented in combination with any of the other embodiments, as appropriate.

By application of this embodiment, a semiconductor substrate including a single crystal semiconductor layer with favorable planarity and crystallinity can be efficiently manufactured. In addition, by application of this embodiment, generation of a defective substrate can be suppressed in a manufacturing process of the semiconductor substrate. Therefore, a semiconductor substrate including a favorable single crystal semiconductor layer can be manufactured at low cost.

Embodiment 3

In this embodiment, a method for manufacturing a semiconductor device using the above-described semiconductor substrate will be described with reference to FIGS. 3A to 3D, FIGS. 4A to 4D, and FIGS. 5A and 5B. Here, a method for manufacturing a semiconductor device including a plurality of transistors is described as an example of the semiconductor device. Note that various semiconductor devices can be formed with the use of transistors described below in combination.

Figure 3A:
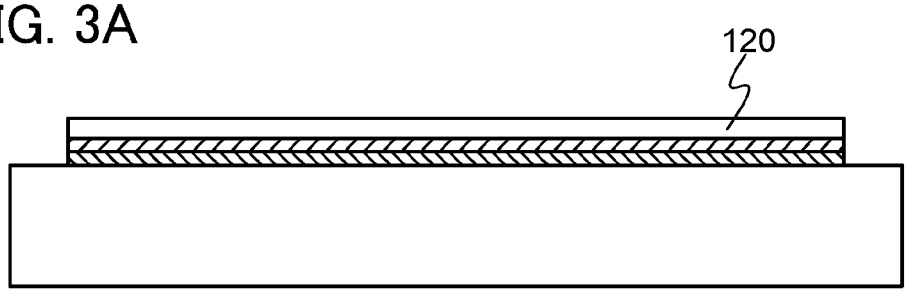
FIGS. 3A to 3D illustrate a manufacturing process of a semiconductor device.
Figure 3B:
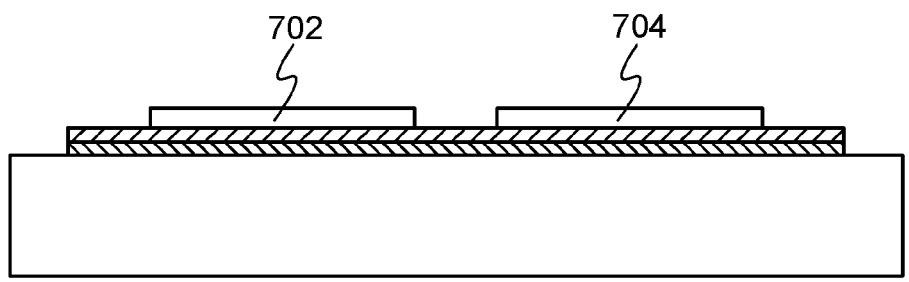

FIG. 3A is a cross-sectional view of a semiconductor substrate manufactured according to Embodiment 2.

To control threshold voltages of TFTs, a p-type impurity such as boron, aluminum, or gallium or an n-type impurity such as phosphorus or arsenic may be added to the single crystal semiconductor layer 120. A region where an impurity is added and a kind of the impurity to be added can be changed as appropriate. For example, a p-type impurity can be added to a formation region of an n-channel TFT, and an n-type impurity can be added to a formation region of a p-channel TFT. The above impurity may be added at a dose of about greater than or equal to $1\times10^{15}$ ions/cm$^2$ and less than or equal to $1\times10^{17}$ ions/cm$^2$. Then, the single crystal semiconductor layer 120 is separated into island shapes, whereby semiconductor layers 702 and 704 are formed (see FIG. 3B).

Figure 3C:
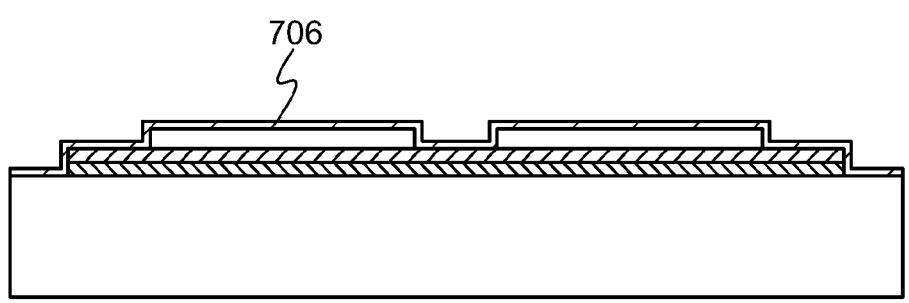

Next, a gate insulating layer 706 is formed so as to cover the semiconductor layers 702 and 704 (see FIG. 3C). Here, a silicon oxide film is formed in a single layer by a plasma-enhanced CVD method. Alternatively, a film containing silicon oxynitride, silicon nitride oxide, silicon nitride, hafnium oxide, aluminum oxide, tantalum oxide, or the like may be formed with a single-layer structure or a stacked structure as the gate insulating layer 706.

As a manufacturing method other than a plasma-enhanced CVD method, a sputtering method and a method of oxidizing or nitriding by high density plasma treatment can be given. High-density plasma treatment is performed by using, for example, a mixed gas of a noble gas such as helium, argon, krypton, or xenon; and a gas such as oxygen, nitrogen oxide, ammonia, nitrogen, or hydrogen. In this case, by exciting plasma by introduction of a microwave, plasma with a low electron temperature and high density can be generated. Each surface of the semiconductor layers is oxidized or nitrided with oxygen radicals (OH radicals may be included) or nitrogen radicals (NH radicals may be included) which are generated by such a high-density plasma, whereby an insulating layer is formed to have a thickness of greater than or equal to 1 nm and less than or equal to 20 nm, preferably greater than or equal to 2 nm and less than or equal to 10 nm so as to be in contact with the semiconductor layers.

Since the semiconductor layers obtained by the high-density plasma treatment are oxidized or nitrided by a solid-phase reaction, the interface state density between the gate insulating layer 706 and each of the semiconductor layers 702 and 704 can be drastically decreased. Further, by directly oxidizing or nitriding the semiconductor layers by high-density plasma treatment, variations in thickness of the insulating layer to be formed can be suppressed. Since the semiconductor layers have crystallinity, even when surfaces of the semiconductor layers are oxidized by a solid-phase reaction by using high-density plasma treatment, nonuniform oxidation in a crystal grain boundary can be suppressed; thus, a gate insulating layer with favorable uniformity and a low interface state density can be formed. A transistor including the insulating layer formed by high-density plasma treatment in this manner in part of the gate insulating layer of the transistor or as the whole gate insulating layer of the transistor can have little variation in the characteristics.

A more specific example of a method for manufacturing an insulating layer by a plasma treatment is described. The surfaces of the semiconductor layers 702 and 704 are oxidized or nitrided in such a manner that nitrous oxide ($N_2O$) is diluted to be greater than or equal to 1 time and less than or equal to 3 times (the flow ratio) with argon (Ar) and a microwave power (2.45 GHz) greater than or equal to 3 kW and less than or equal to 5 kW is applied under a pressure greater than or equal to 10 Pa and less than or equal to 30 Pa. By this treatment, a lower layer of the gate insulating layer 706 with a thickness greater than or equal to 1 nm and less than or equal to 10 nm (preferably, greater than or equal to 2 nm and less than or equal to 6 nm) is formed. Further, a silicon oxynitride film is formed as an upper layer of the gate insulating layer 706 by a vapor-phase growth method in such a manner that nitrous oxide ($N_2O$) and silane ($SiH_4$) are introduced and a microwave power (2.45 GHz) greater than or equal to 3 kW and less than or equal to 5 kW is applied under a pressure greater than or equal to 10 Pa and less than or equal to 30 Pa. The gate insulating layer 706 is formed by combining solid phase reaction and a vapor-phase growth method as described above, whereby the gate insulating layer 706 with a low interface state density and an excellent withstand voltage can be formed. Note that in this case, the gate insulating layer 706 has a two-layer structure.

Alternatively, the gate insulating layer 706 may be formed by thermally oxidizing the semiconductor layers 702 and 704. In the case of forming the gate insulating layer by such thermal oxidation, a base substrate with a comparatively high heat resistance is preferably used.

Further alternatively, hydrogen contained in the gate insulating layer 706 may be dispersed in the semiconductor layers 702 and 704 by performing heat treatment at a temperature higher than or equal to 350° C. and lower than or equal to 450° C. after the gate insulating layer 706 containing hydrogen is formed. In this case, the gate insulating layer 706 may be formed using silicon nitride or silicon nitride oxide by a plasma-enhanced CVD method. Note that in this case, a process temperature may be set to lower than or equal to 350° C. In this manner, hydrogen is supplied to the semiconductor layers 702 and 704, whereby defects in the semiconductor layers 702 and 704, at an interface between the gate insulating layer 706 and the semiconductor layer 702, and at an interface between the gate insulating layer 706 and the semiconductor layer 704 can be effectively reduced.

Figure 3D:
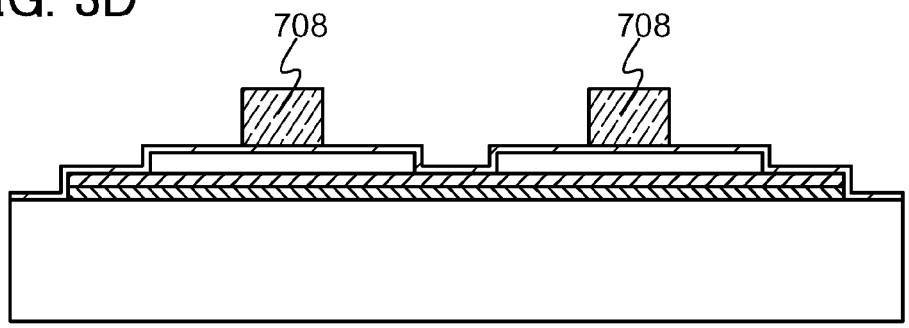

Next, a conductive layer is formed over the gate insulating layer 706, and then the conductive layer is processed (patterned) into a predetermined shape, whereby electrodes 708 are formed over the semiconductor layers 702 and 704 (see FIG. 3D). The conductive layer can be formed by a CVD method, a sputtering method, or the like. The conductive layer can be formed from a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material such as polycrystalline silicon, which is obtained by doping a semiconductor with an impurity element that imparts a conductivity type, or the like may be used.

Although the electrodes 708 are formed as a single-layer conductive layer in this embodiment, the semiconductor device of this embodiment is not limited to the structure. The electrodes 708 may be formed as a plurality of stacked conductive layers. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be used.

Note that a mask used for forming the electrodes 708 may be formed using a material such as silicon oxide or silicon nitride oxide. In this case, a process for forming a mask by patterning a silicon oxide film, a silicon nitride oxide film, or the like is additionally needed; however, the amount of the reduced film thickness of the mask in etching is smaller than the resist material; thus, the electrodes 708 with an accurate shape can be formed. Alternatively, the electrodes 708 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrodes 708 can be formed by etching the conductive layer to have a desired tapered shape by an inductively coupled plasma (ICP) etching method with appropriate adjustment of the etching conditions (e.g., the amount of electric power applied to a coiled electrode layer, the amount of electric power applied to an electrode layer on the substrate side, the electrode temperature on the substrate side, and the like). The tapered shape can be adjusted according to the shape of the mask. As the etching gas, a chloride gas such as chlorine, boron chloride, silicon chloride, or carbon tetrachloride; a fluoride gas such as carbon tetrafluoride, sulfur fluoride, or nitrogen fluoride; oxygen; or the like is used as appropriate.

Figure 4A:
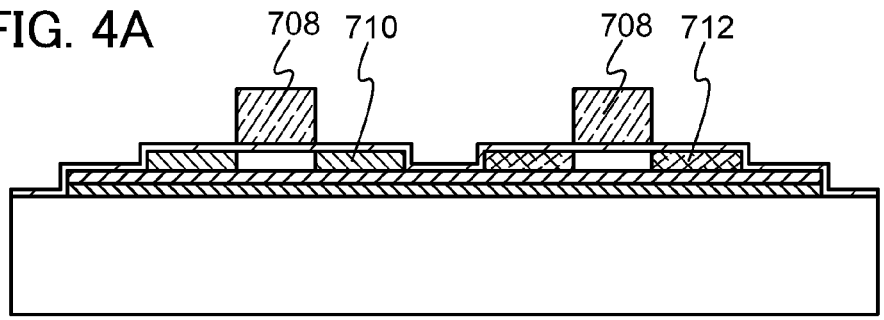
FIGS. 4A to 4D illustrate a manufacturing process of a semiconductor device.

Next, an impurity element imparting one conductivity type is added to the semiconductor layers 702 and 704 using the electrodes 708 as masks (see FIG. 4A). In this embodiment, an impurity element imparting n-type conductivity (for example, phosphorus or arsenic) is added to the semiconductor layer 702, and an impurity element imparting p-type conductivity (for example, boron) is added to the semiconductor layer 704. Note that when the impurity element imparting n-type conductivity is added to the semiconductor layer 702, the semiconductor layer 704 to which the impurity element imparting p-type conductivity is added is covered with a mask or the like so that the impurity element imparting n-type conductivity is added selectively. Further, when the impurity element imparting p-type conductivity is added to the semiconductor layer 704, the semiconductor layer 702 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 702 and 704, the other of the impurity element imparting p-type conductivity and the impurity element imparting n-type conductivity may be added only to one of the semiconductor layers at a higher concentration. By the addition of the impurity, impurity regions 710 and impurity regions 712 are formed in the semiconductor layer 702 and the semiconductor layer 704, respectively.

Figure 4B:
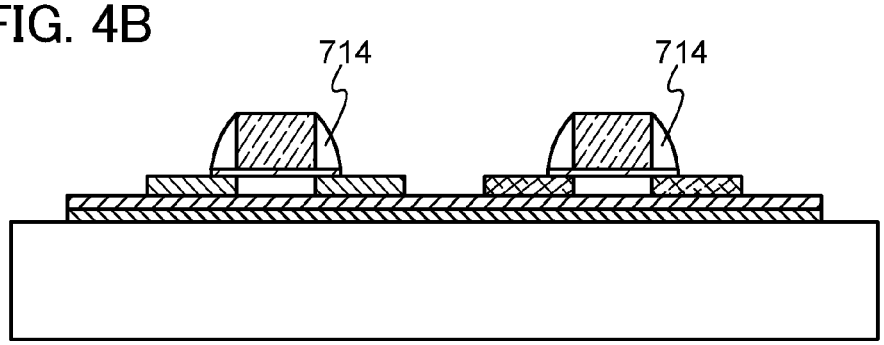

Next, sidewalls 714 are formed on side surfaces of the electrodes 708 (see FIG. 4B). The sidewalls 714 can be formed by, for example, newly forming an insulating layer so as to cover the gate insulating layer 706 and the electrodes 708 and by partially etching the insulating layer by anisotropic etching mainly in a perpendicular direction. Note that the gate insulating layer 706 may also be etched partially by the anisotropic etching described above. As the insulating layer for forming the sidewalls 714, a film containing silicon, silicon oxide, silicon nitride, silicon oxynitride, silicon nitride oxide, an organic material, or the like may be formed to have a single-layer structure or a stacked structure by a plasma-enhanced CVD method, a sputtering method, or the like. In this embodiment, a 100-nm-thick silicon oxide film is formed by a plasma-enhanced CVD method. In addition, as an etching gas, a mixed gas of $CHF_3$ and helium can be used. Note that a process for forming the sidewalls 714 is not limited thereto.

Figure 4C:
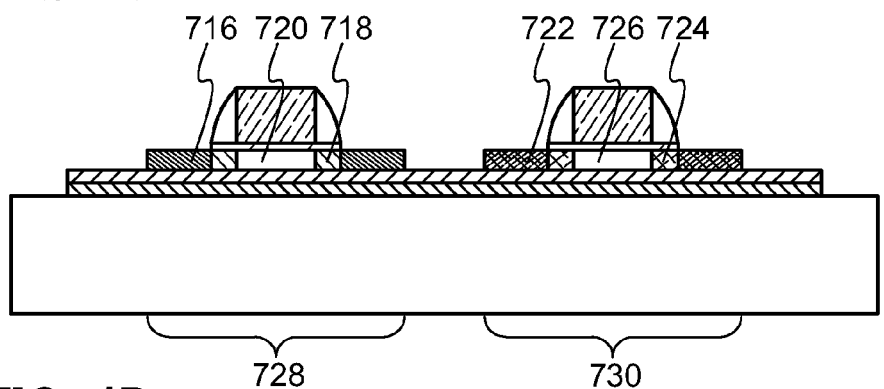

Next, an impurity element imparting one conductivity type is added to the semiconductor layers 702 and 704 using the gate insulating layer 706, the electrodes 708, and the sidewalls 714 as masks (see FIG. 4C). Note that the impurity element imparting the same conductivity type as the impurity element which has been added to the semiconductor layers 702 and 704 in the previous process is added to the semiconductor layers 702 and 704 at a higher concentration. Note that when the impurity element imparting n-type conductivity is added to the semiconductor layer 702, the semiconductor layer 704 to which the impurity element imparting p-type conductivity is added is covered with a mask or the like so that the impurity element imparting n-type conductivity is added selectively. Further, when the impurity element imparting p-type conductivity is added to the semiconductor layer 704, the semiconductor layer 702 to which the impurity element imparting n-type conductivity is added is covered with a mask or the like so that the impurity element imparting p-type conductivity is added selectively.

By the above-described addition of the impurity element, a pair of high-concentration impurity regions 716, a pair of low-concentration impurity regions 718, and a channel formation region 720 are formed in the semiconductor layer 702. In addition, by the above-described addition of the impurity element, a pair of high-concentration impurity regions 722, a pair of low-concentration impurity regions 724, and a channel formation region 726 are formed in the semiconductor layer 704. The high-concentration impurity regions 716 and the high-concentration impurity regions 722 each function as a source or a drain, and the low-concentration impurity regions 718 and the low-concentration impurity regions 724 each function as an LDD (lightly doped drain) region.

Note that the sidewalls 714 formed over the semiconductor layer 702 and the sidewalls 714 formed over the semiconductor layer 704 may be formed so as to have the same length in a direction where carriers move (a direction parallel to a so-called channel length), or may be formed so as to have different lengths. The length of each of the sidewalls 714 over the semiconductor layer 704 which constitutes part of a p-channel transistor may be larger than the length of each of the sidewalls 714 over the semiconductor layer 702 which constitutes part of an n-channel transistor. This is because boron which is added for forming a source and a drain in the p-channel transistor is easily diffused and a short channel effect is easily induced. By making the length of each sidewall 714 in the p-channel transistor larger than that of each sidewall 714 in the n-channel transistor, boron can be added to the source and the drain in the p-channel transistor at a high concentration, and thus the resistance of the source and the drain can be reduced.

In order to further reduce the resistance of the source and the drain, a silicide layer may be formed by solidification of parts of the semiconductor layers 702 and 704. The silicide is formed by placing metal in contact with the semiconductor layers and causing a reaction between the metal and silicon in the semiconductor layers by heat treatment (for example, a GRTA method, an LRTA method, or the like). The silicide layer may be formed from cobalt silicide or nickel silicide. In the case where the semiconductor layers 702 and 704 are thin, silicide reaction may proceed to bottoms of the semiconductor layers 702 and 704. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, the silicide layer can also be formed by laser irradiation or the like.

Through the process described above, an n-channel transistor 728 and a p-channel transistor 730 are formed. Note that although conductive layers each functioning as a source electrode or a drain electrode are not formed in a stage illustrated in FIG. 4C, a structure including these conductive layers each functioning as a source electrode or a drain electrode may also be referred to as a transistor.

Figure 4D:
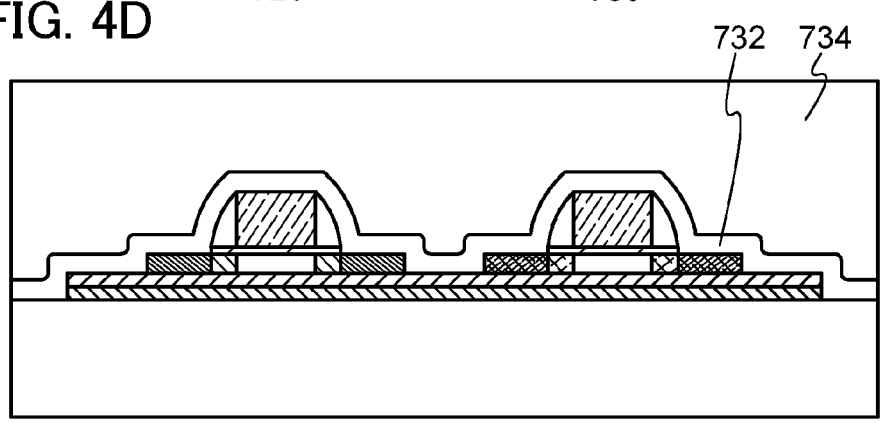

Next, an insulating layer 732 is formed to cover the n-channel transistor 728 and the p-channel transistor 730 (see FIG. 4D). The insulating layer 732 is not always necessary; however, the formation of the insulating layer 732 can prevent impurities such as alkali metal or alkaline-earth metal from penetrating the n-channel transistor 728 and the p-channel transistor 730. Specifically, the insulating layer 732 is preferably formed from a material such as silicon oxide, silicon nitride, silicon oxynitride, silicon nitride oxide, aluminum nitride, aluminum oxide, or the like. In this embodiment, the insulating layer 732 is formed of a silicon nitride oxide film with a thickness of about 600 nm. In this case, the above-described hydrogenation process may be performed after the silicon nitride oxide film is formed. Note that although the insulating layer 732 is formed to have a single-layer structure in this embodiment, it is needless to say that the insulating layer 732 may have a stacked structure. For example, in the case of a two-layer structure, the insulating layer 732 may have a stacked structure of a silicon oxynitride film and a silicon nitride oxide film.

Next, an insulating layer 734 is formed over the insulating layer 732 to cover the n-channel transistor 728 and the p-channel transistor 730. The insulating layer 734 may be formed using an organic material having resistance against heat, such as polyimide, acrylic, benzocyclobutene, polyamide, or epoxy. As an alternative to the organic materials listed above, a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like may be used. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Alternatively, the insulating layer 734 may be formed by stacking a plurality of insulating layers formed using any of these materials.

The insulating layer 734 can be formed by any of the following methods and means depending on the material of the insulating layer 734: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, and the like.

Next, contact holes are formed in the insulating layers 732 and 734 so that each of the semiconductor layers 702 and 704 is partially exposed. Then, conductive layers 736 and conductive layers 738 are formed to be in contact with the semiconductor layer 702 and the semiconductor layer 704, respectively, through the contact holes (see FIG. 5A). The conductive layers 736 and the conductive layers 738 each function as a source electrode or a drain electrode of a transistor. Note that in this embodiment, as an etching gas for forming the contact holes, a mixed gas of $CHF_3$ and He is employed; however, the etching gas is not limited thereto.

The conductive layers 736 and the conductive layers 738 can be formed by a CVD method, a sputtering method, or the like. Specifically, the conductive layers 736 and the conductive layers 738 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. The conductive layers 736 and the conductive layers 738 may each have a single-layer structure or a stacked structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Since aluminum and aluminum silicon (Al—Si) have low resistance values and are inexpensive, aluminum and aluminum silicon are suitable as a material for forming the conductive layers 736 and the conductive layers 738. In particular, aluminum silicon is preferable because a hillock can be prevented from generating in resist baking at the time of patterning. Further, a material in which Cu is mixed into aluminum at about 0.5% may be used instead of silicon.

In the case where each of the conductive layers 736 and the conductive layers 738 is formed to have a stacked structure, a stacked structure of a barrier film, an aluminum silicon film, and a barrier film; a stacked structure of a barrier film, an aluminum silicon film, a titanium nitride film, and a barrier film; or the like may be employed, for example. Note that the barrier film refers to a film formed using titanium, nitride of titanium, molybdenum, nitride of molybdenum, or the like. By forming the conductive layers so as to sandwich an aluminum silicon film between the barrier films, generation of hillocks of aluminum or aluminum silicon can be further prevented. Moreover, by forming the barrier film using titanium that is a highly reducible element, even if a thin oxide film is formed over the semiconductor layers 702 and 704, the oxide film is reduced by the titanium contained in the barrier film, whereby preferable contact between the conductive layers 736 and the semiconductor layer 702 and between the conductive layers 738 and the semiconductor layer 704 can be obtained. Further, it is also possible to stack a plurality of barrier films. In that case, for example, each of the conductive layers 736 and the conductive layers 738 can be formed to have a five-layer structure of titanium, titanium nitride, aluminum silicon, titanium, and titanium nitride in order from the bottom or a stacked structure of more than the five layers.

As the conductive layers 736 and the conductive layers 738, tungsten silicide formed by a chemical vapor deposition method using a $WF_6$ gas and a $SiH_4$ gas may be used. Alternatively, tungsten formed by hydrogen reduction of $WF_6$ may be used as the conductive layers 736 and the conductive layers 738.

Note that the conductive layers 736 are connected to the high-concentration impurity regions 716 of the n-channel transistor 728. The conductive layers 738 are connected to the high-concentration impurity regions 722 of the p-channel transistor 730.

Figure 5A:
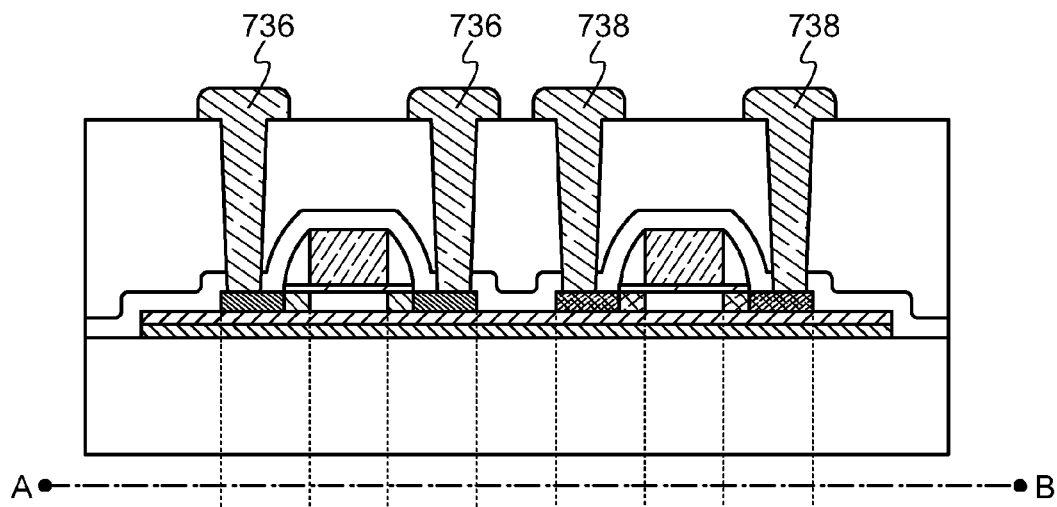
FIGS. 5A and 5B are a plan view and a cross-sectional view of a semiconductor device, respectively.
Figure 5B:
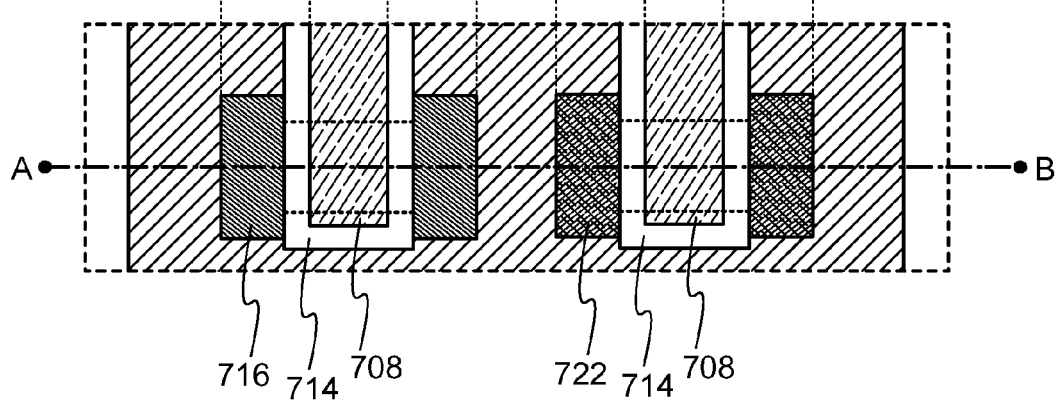

FIG. 5B illustrates a plan view of the n-channel transistor 728 and the p-channel transistor 730 which are illustrated in FIG. 5A. Here, the cross section taken along line A-B of FIG. 5B corresponds to FIG. 5A. However, in FIG. 5B, the conductive layers 736, the conductive layers 738, the insulating layers 732 and 734, and the like are omitted for simplicity.

Note that although this embodiment describes as an example the case where each of the n-channel transistor 728 and the p-channel transistor 730 includes one electrode 708 functioning as the gate electrode, this embodiment is not limited to this structure. The transistor manufactured in this embodiment may have a multi-gate structure in which a plurality of electrodes functioning as gate electrodes are included and electrically connected to one another.

In this embodiment, defects and surface unevenness of a single crystal semiconductor layer are reduced by performing laser irradiation instead of performing mechanical polishing treatment or the like. Further, an embodiment of the invention is used; accordingly, laser irradiation conditions can be optimized by a very easy method. Thus, a semiconductor substrate in which defects are reduced sufficiently and planarity is improved can be provided, and cost thereof can be suppressed. Accordingly, a transistor which can be operated at high speed and driven at a low voltage and has a low subthreshold value and high field-effect mobility can be manufactured at low cost by using the semiconductor substrate.

This embodiment can be implemented in combination with any of the other embodiments, as appropriate.

Embodiment 4

A semiconductor device such as a transistor can be manufactured using a semiconductor substrate according to an embodiment of the present invention, and a variety of electronic devices can be completed using the semiconductor device. Since a single crystal semiconductor layer which is provided in the semiconductor substrate according to an embodiment of the present invention has high planarity, a gate insulating layer which is thin and has a high withstand voltage can be formed over the single crystal semiconductor layer, and then improvement of mobility and suppression of a short channel effect of a semiconductor element which is formed can be achieved. That is, by using the semiconductor substrate according to an embodiment of the present invention, a semiconductor element with high current driving capability and high reliability can be manufactured; accordingly, an electronic device as a final product can be manufactured with high throughput and favorable quality. In this embodiment, specific application examples to electronic devices are described with reference to drawings.

As electronic devices manufactured using a semiconductor device (particularly a display device), the following can be given: cameras such as a video camera and a digital camera, goggle-type displays (head mounted displays), navigation systems, audio reproducing devices (such as car audio components), computers, game machines, portable information terminals (such as a mobile computer, a cellular phone, a portable game machine, and an e-book reader), and image reproducing devices provided with a recording medium (specifically, a device provided with a display that can reproduce a recording medium such as a digital versatile disc (DVD) and display the image), and the like.

Figure 6A:
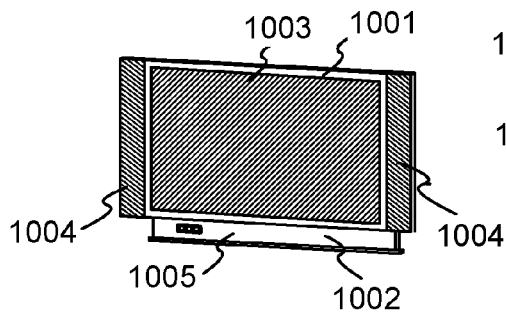
FIGS. 6A to 6E are drawings each illustrating an electronic device using a semiconductor device.

FIG. 6A illustrates a television set or a monitor of a personal computer. A housing 1001, a support base 1002, a display portion 1003, a speaker portion 1004, a video input terminal 1005, and the like are included. A semiconductor device of an embodiment of the present invention is used for the display portion 1003. By an embodiment of the present invention, a television set or monitor of a personal computer with high reliability and high performance can be provided at low cost.

Figure 6B:
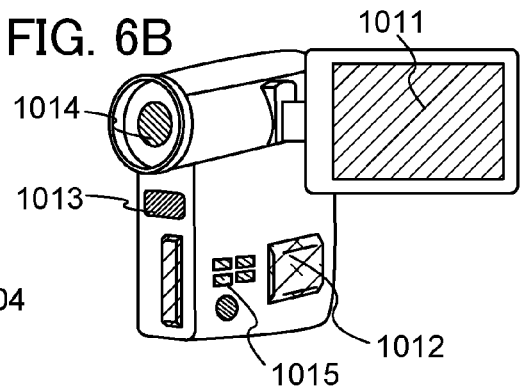

FIG. 6B is a video camera, which includes a display portion 1011, an external connection port 1012, a remote control receiving portion 1013, an image receiving portion 1014, operation keys 1015, and the like. The semiconductor device of an embodiment of the present invention is used in the display portion 1011. Accordingly, a digital camera having high reliability and high performance can be provided at low cost.

Figure 6C:
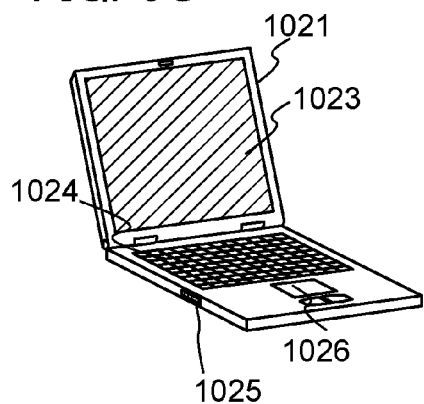

FIG. 6C illustrates a notebook personal computer. A main body 1021 is provided with a keyboard 1024, an external connection port 1025, and a pointing device 1026. A display portion 1023 is attached to the main body 1021. A semiconductor device of an embodiment of the present invention is used for the display portion 1023. Accordingly, a notebook personal computer having high reliability and high performance can be provided at low cost.

Figure 6D:
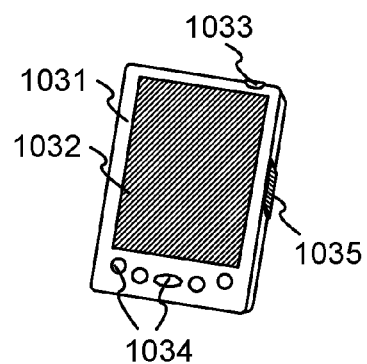

FIG. 6D illustrates a mobile computer, which includes a main body 1031, a display portion 1032, a switch 1033, operation keys 1034, an infrared port 1035, and the like. An active matrix display device is provided for the display portion 1032. A semiconductor device of an embodiment of the present invention is used for the display portion 1032. Accordingly, a mobile computer having high reliability and high performance can be provided at low cost.

Figure 6E:
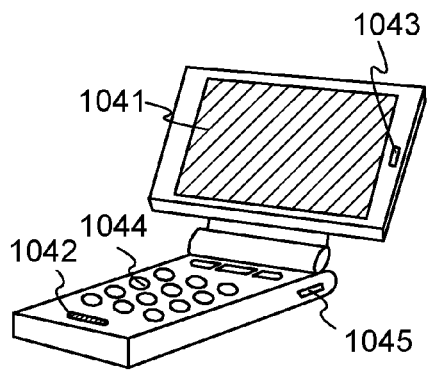

FIG. 6E illustrates a cellular phone, which includes a display portion 1041, an audio input portion 1042, an audio output portion 1043, operation keys 1044, an external connection port 1045, and the like. Note that this cellular phone is manufactured using a light-emitting device which is formed using an embodiment of the present invention in the display portion 1041. Accordingly, a cellular phone having high reliability and high performance can be provided at low cost. Further, the cellular phone may include an infrared communication function, a function of a television receiver, or the like.

Figure 7A:
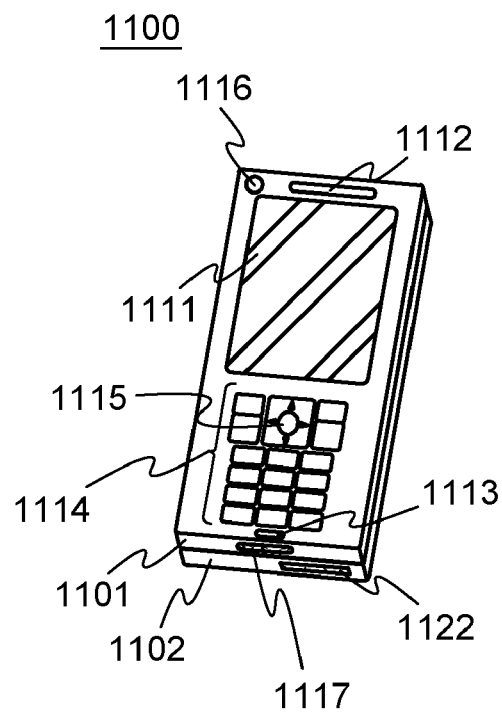
FIGS. 7A to 7C are drawings illustrating an electronic device using a semiconductor device.
Figure 7B:
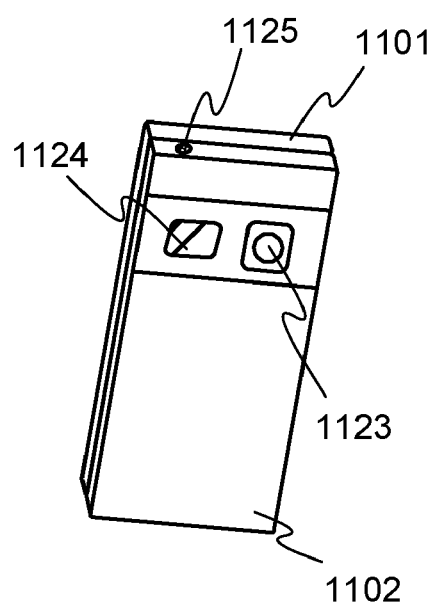
Figure 7C:
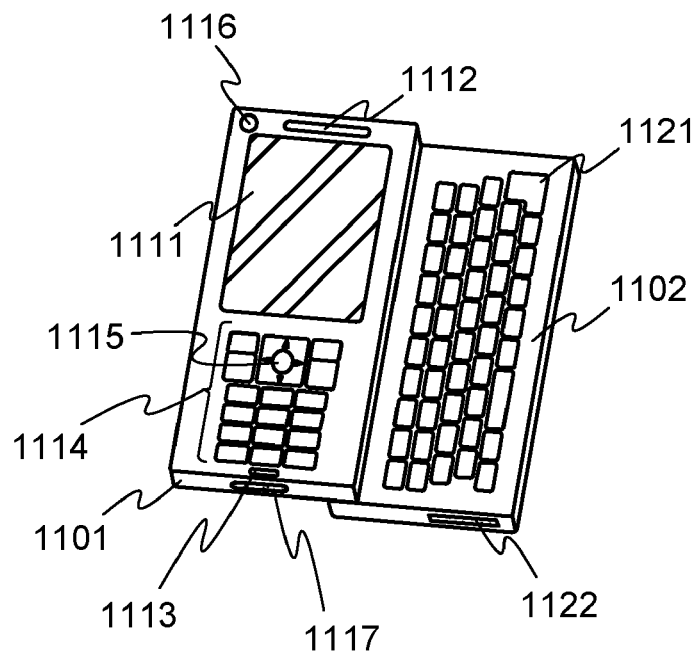

FIGS. 7A to 7C illustrate a structural example of a portable electronic device 1100 having functions as a telephone and an information terminal FIG. 7A is a front view, FIG. 7B is a back view, and FIG. 7C is a developed view. The portable electronic device 1100 has functions as both a telephone and an information terminal and is an electronic device so-called a smartphone which is capable of various data processing in addition to voice call.

The portable electronic device 1100 includes a housing 1101 and a housing 1102. The housing 1101 includes a display portion 1111, a speaker 1112, a microphone 1113, operation keys 1114, a pointing device 1115, a camera lens 1116, an external connection terminal 1117, and the like, while the housing 1102 includes a keyboard 1121, an external memory slot 1122, a camera lens 1123, a light 1124, an earphone terminal 1125, and the like. In addition, an antenna is incorporated in the housing 1101. In addition to the above-described structure, a wireless IC chip, a small size memory device, or the like can be built therein.

A semiconductor device of an embodiment of the present invention is incorporated in the display portion 1111. Note that an image displayed (and direction in which the image is displayed) in the display portion 1111 variously changes depending on a usage pattern of the portable electronic device 1100. Moreover, since the display portion 1111 and the camera lens 1116 are provided on the same surface, voice call (so-called videophone) with images is possible. Note that the speaker 1112 and the microphone 1113 can be used not only for voice call but also for recording, reproducing, or the like. In the case where a still image and a moving image are shot by using the camera lens 1123 (and the light 1124), the display portion 1111 is used as a finder. The operation keys 1114 are used for incoming/outgoing of phone call, inputting simple information such as e-mail, screen scrolling, moving cursor, and the like.

Furthermore, the housing 1101 and the housing 1102 (FIG. 7A), which are overlapped with each other, are developed by sliding as illustrated in FIG. 7C and the portable electronic device can be used as a portable information terminal. In this case, smooth operation can be conducted using the keyboard 1121 and the pointing device 1115. The external connection terminal 1117 can be connected to an AC adaptor and various types of cables such as a USB cable, and charging, data communication with a computer, and the like are possible. Furthermore, a large amount of data can be stored and moved by inserting a storage medium into the external memory slot 1122. In addition to the above-described functions, a function of wireless communication by using electromagnetic waves such as infrared rays, a function of receiving television, and the like may be included. By using a semiconductor device of an embodiment of the present invention, a portable electronic device having high reliability and high performance can be provided at low cost.

As described above, the semiconductor device of an embodiment of the present invention covers a very wide range of applications and can be used in electronic devices in various fields. This embodiment can be implemented in combination with any of the other embodiments, as appropriate.

Example 1

Figure 8:
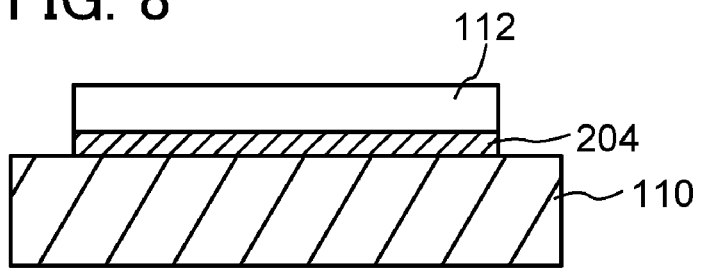
FIG. 8 is a cross-sectional view of a semiconductor substrate used in Example 1.

In this example, in a single crystal semiconductor layer which is irradiated with a laser beam, energy density $E_{max}$ when the peak value of a detection signal of a reflected microwave is the maximum is correlative with the thickness of the single crystal semiconductor layer, which will be described with reference to FIG. 8 and FIGS. 9A and 9B. To evaluate the correlation between the $E_{max}$ and the thickness of the single crystal semiconductor layer, in this example, five types of semiconductor substrates which have different thicknesses of single crystal semiconductor layers are formed.

A method for manufacturing a semiconductor substrate of this example is hereinafter described. FIG. 8 is a cross-sectional view illustrating a stacked structure of a semiconductor substrate used for this example. The semiconductor substrate is formed using the manufacturing method of Embodiment 2 (see FIGS. 2A to 2F), and the single crystal semiconductor layer 112 is fixed to the base substrate 110 with an insulating layer interposed therebetween.

A non-alkali glass substrate (product name: AN100) is used as the base substrate 110 in this example. The AN100 has physical properties of a specific gravity of 2.51 g/cm$^3$, a Poisson's ratio of 0.22, a Young's modulus of 77 GPa, a two-axes elastic coefficient of 98.7 GPa, and a coefficient of thermal expansion of 38×10$^{-7}$/° C.

As a single crystal semiconductor substrate for forming the single crystal semiconductor layer 112, a single crystal silicon wafer is used, and a single crystal silicon layer is formed as the single crystal semiconductor layer 112. The single crystal silicon wafer is a rectangular substrate with 5 square inches. The conductivity type of the wafer is a p type, and the resistivity thereof is about 10 Ω·cm. In addition, the crystal orientation on its main surface is (100) and that on its side surface is <110>.

The single crystal semiconductor substrate is subjected to thermal oxidation treatment, and a silicon oxide film 204 functioning as an insulating layer is formed. The temperature of the thermal oxidation treatment is set to be 950° C. and the thickness of the oxide silicon film 204 is set to be 100 nm. As the atmosphere of the thermal oxidation treatment, an atmosphere including HCl at 3 volume % with respect to oxygen is used.

In order to form an embrittlement layer in the single crystal silicon wafer, hydrogen ions are added to the single crystal silicon wafer by using an ion doping apparatus. A 100% hydrogen gas is used as a source gas, and the single crystal silicon wafer substrate is irradiated with ions in plasma that has been generated by excitation of the hydrogen gas and accelerated by an electric field without mass separation. Accordingly, the embrittlement layer is formed. The condition of the hydrogen ion doping is set as follows: the power output of 100 W, the acceleration voltage of 40 kV, and the dose of 2.0×10$^{16}$ ions/cm$^3$, for example.

After the base substrate 110 and the single crystal semiconductor substrate are subjected to ultrasonic cleaning in pure water and then cleaned with ozone-containing pure water, the surface of the base substrate 110 and the silicon oxide film formed on the surface of the single crystal semiconductor substrate are arranged in close contact with each other and bonded to each other. Next, to perform separation at the embrittlement layer, heat treatment is performed at 200° C. for 2 hours in a heating furnace, and then heating is successively performed at 600° C. for 4 hours in the heating furnace. Accordingly, the single crystal semiconductor substrate is separated, and the single crystal semiconductor layer 112 is fixed to the base substrate.

Next, after the surface of the single crystal semiconductor layer 112 is cleaned with pure water, the single crystal semiconductor layer 112 is treated with a 100-fold diluted hydrofluoric acid to remove a native oxide film that is formed on the surface. Then, the surface of the single crystal semiconductor layer 112 is treated with ozone-containing water (O$_3$ water), whereby an oxide film is formed.

Next, the single crystal semiconductor layer 112 is subjected to etching treatment, whereby the oxide film and the embrittlement layer which has been left on the separation plane of the single crystal semiconductor layer 112 are removed. In this example, the separation plane of the single crystal semiconductor layer 112 is subjected to dry etching treatment, and five types (a to e) of the semiconductor substrates which have different thicknesses of the single crystal semiconductor layers 112 are formed. The conditions a to e are as follows.

a. a thickness of 110 nm
b. a thickness of 92 nm
c. a thickness of 73 nm
d. a thickness of 58 nm
e. a thickness of 51 nm Next, the single crystal semiconductor layers 112 under the conditions a to e are irradiated with their respective laser beams. For laser irradiation, a XeCl excimer laser which emits a beam at a wavelength of 308 nm is used. The repetition rate of each laser beam is 30 Hz. Through an optical system, the laser beam is collected such that it has a linear beam shape on an irradiation surface, and scanning with the laser beam is performed in a width direction (a short-axis direction of the beam shape) at 1 min/sec. The energy density of the laser beam is gradually changed by about 10 mJ/cm$^2$, and one piece of semiconductor substrate is irradiated with a laser beam under ten different conditions of the energy density. The laser irradiation is performed with a nitrogen gas blown on an irradiated region at a room temperature.

Figure 9A:
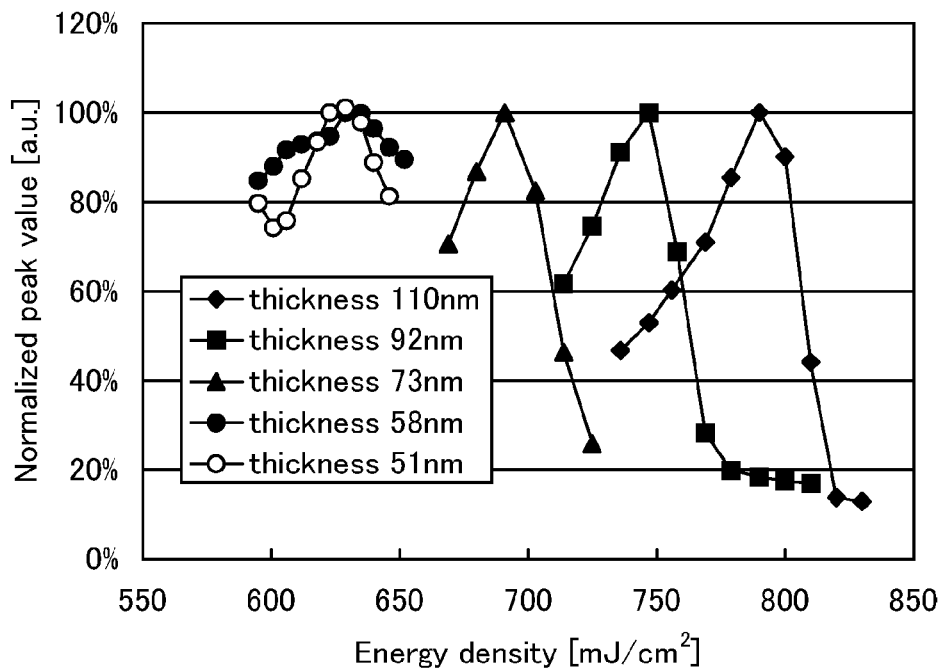
FIGS. 9A and 9B are graphs illustrating correlations between thicknesses and peak values of single crystal semiconductor layers.

In FIG. 9A, measurement results of the crystallinity of the single crystal semiconductor layers 112 which have been irradiated with the laser beams under the conditions a to e by a μ-PCD method are illustrated. In FIG. 9A, the vertical axis represents a peak value of a detection signal of a reflected microwave, and the higher the peak value is, the longer the lifetime is, that is, crystallinity is favorable. Note that the peak value is proportional to the thickness of the single crystal semiconductor layer; accordingly, in FIG. 9A, a value which is normalized by dividing a peak value by a thickness is used for graphs. In FIG. 9A, the horizontal axis represents the energy density of the laser beams.

In FIG. 9A, any graphs under the conditions a to e have the maximum values. This is because in a region where the energy density is lower than or equal to the energy density whose peak value is the maximum, the single crystal semiconductor layer 112 is in a partially melted state, and a region where defects are repaired by melting expands as the energy density is higher, while in a region where the energy density is higher than the energy density when the peak value is the maximum, the single crystal semiconductor layer 112 is in a completely melted state to be microcrystallized. It is found from FIG. 9A that as the thickness of the single crystal semiconductor layer is larger, the energy density when the peak value is the maximum is increased.

Figure 9B:
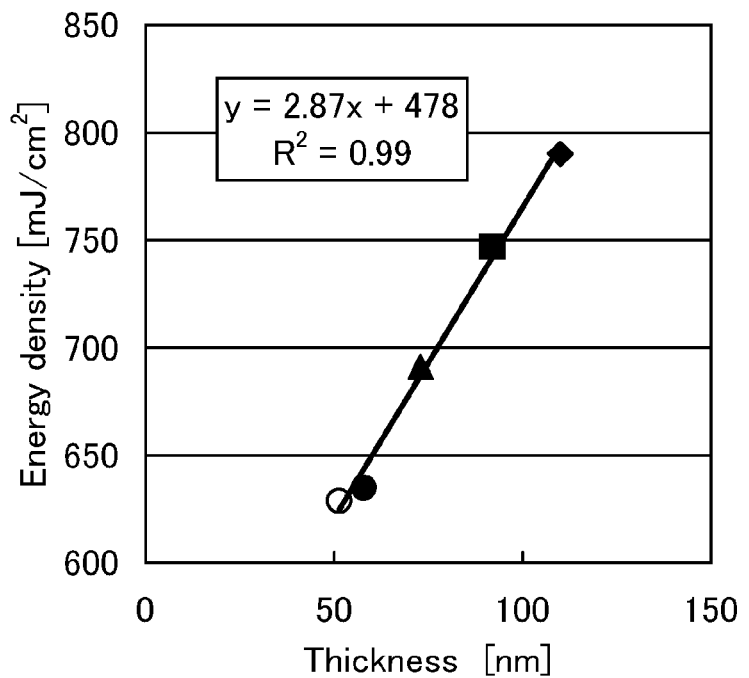

In FIG. 9B, the relations between the energy density when the peak value ($E_{max}$) is the maximum and the thicknesses of the single crystal semiconductor layers under the conditions a to e are illustrated. In FIG. 9B, the vertical axis represents the $E_{max}$ under the conditions a to e, and the horizontal axis represents the thicknesses of the single crystal semiconductor layers under the conditions a to e. In addition, in FIG. 9B, a diamond shape represents the $E_{max}$ under the condition a, a square represents the $E_{max}$ under the condition b, a triangular shape represents the $E_{max}$ under the condition c, a black circular shape represents the $E_{max}$ under the condition d, and a white circular shape represents the $E_{max}$ under the condition e.

It is found from FIG. 9B, when the thickness of the single crystal semiconductor layer is increased, the energy density ($E_{max}$) when the peak value is the maximum is increased in direct proportion to the thickness, and there is a linear correlation between the thickness of the single crystal semiconductor layer and the $E_{max}$. When an approximate expression is calculated, the following Formula 15 is obtained. It can be said that the correlation coefficient of Formula 15 is 0.99 and there is a strong correlation between the thickness of the single crystal semiconductor layer and the $E_{max}$.

$y=2.87x+478$ [Formula 15]

From Formula 15, when the thickness of the single crystal semiconductor layer 112 is increased by 1 nm, the $E_{max}$ is increased by 2.87 mJ/cm². In addition, it is thought that the intercept of the linear function is not 0 due to an effect such as thermal release to the semiconductor substrate.

As a method for manufacturing a semiconductor substrate according to an embodiment of the present invention, the energy density $E1_{max}$ when the intensity of a reflected microwave is the maximum in the monitor substrate is detected by a μ-PCD method, and with energy density E which is lower than the $E1_{max}$, that is, with the energy density E which preferably satisfies the following Formula 16, more preferably the following Formula 17, (n−1) pieces of semiconductor substrates are irradiated with their respective laser beams. Accordingly, even there are variation in thicknesses of the single crystal semiconductor layers and variation of the energy density of each laser beam with which the semiconductor substrates are irradiated, the rate of occurrence of defective substrates in a manufacturing process of the semiconductor substrates can be suppressed to less than or equal to 50 ppm (that is, the rate of occurrence of defective substrates is less than or equal to 1 per 20000).

$0.90E1_{max}+3.9\sigma \leq E \leq E1_{max}-3.9\sigma$ [Formula 16]

$0.90E1_{max}+3.9\sigma \leq E \leq E1_{max}-3.9\sigma$ [Formula 17]

Since the value of the $E_{max}$ depends on the thickness of the single crystal semiconductor layer 112, the $E_{max}$ with respect to the single crystal semiconductor layer 112 having a thickness of d is expressed by A×d+B, where A represents a constant of proportionality and B represents an intercept. When the thickness of the single crystal semiconductor layer 112 included in the monitor substrate is equivalent to the median of thicknesses of the single crystal semiconductor layers 112 provided in n pieces of the semiconductor substrates, a value, which is calculated such that a difference between the thickness of the single crystal semiconductor layer 112 (single crystal semiconductor layer N) provided in the n-th semiconductor substrate and the median of the thicknesses is multiplied by the constant of proportionality A, corresponds to a difference between the $E_{max}$ in the monitor substrate and the $E_{max}$ in the single crystal semiconductor layer N. Therefore, a value, in which the standard deviation of the thicknesses of n pieces of the single crystal semiconductor layers 112 is multiplied by the constant of proportionality A, equals to the relative standard deviation $\sigma_t$ of the $E_{max}$ in each of n pieces of the single crystal semiconductor layers. Since the constant of proportionality A is 2.87 according to Formula 15, when the standard deviation of the thicknesses of n pieces of the single crystal semiconductor layers is expressed by $\sigma_d$, variation σ of the energy density E with which (n−1) pieces of the semiconductor substrates are irradiated in Formula 16 and Formula 17 is expressed by the following Formula 18.

$\sigma = \sqrt{(2.87\sigma_d)^2 + \sigma_e^2}$ [Formula 18]

Example 2

Figure 10:
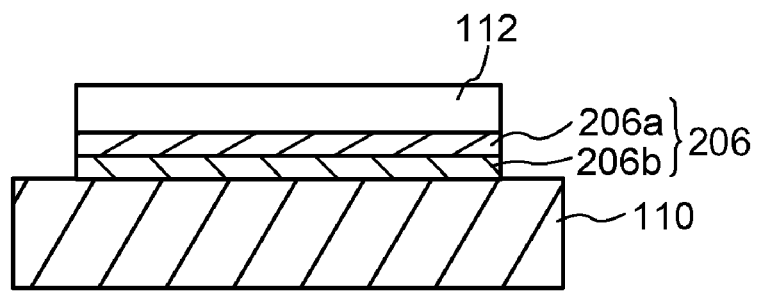
FIG. 10 is a cross-sectional view of a semiconductor substrate used in Example 2.

In this example, relations between a peak value of a detection signal of a reflected microwave in a single crystal semiconductor layer which is irradiated with a laser beam and a subthreshold value (S value) of a thin film transistor (hereinafter referred to as a TFT) formed using the single crystal semiconductor layer will be described with reference to FIG. 10 and FIG. 11.

A method for manufacturing a semiconductor substrate used in this example is described. FIG. 10 is a cross-sectional view illustrating a stacked structure of the semiconductor substrate of this example. The semiconductor substrate of this example is formed using the manufacturing method described in Embodiment 2, and the single crystal semiconductor layer 112 is fixed to the base substrate 110 with a first insulating layer 206 formed using two layers of a silicon oxide film 206a and a silicon nitride oxide film 206b interposed therebetween.

A non-alkali glass substrate (product name: AN100) is used as the base substrate 110 in this example. As a single crystal semiconductor substrate for forming the single crystal semiconductor layer 112, a single crystal silicon wafer is used, and a single crystal silicon layer is formed as the single crystal semiconductor layer 112.

First, a single crystal semiconductor substrate is subjected to thermal oxidation treatment in an atmosphere including HCl at 3 volume % with respect to oxygen, whereby the silicon oxide film 206a is formed. The temperature of the thermal oxidation treatment is set to be 950° C. and the thickness of the silicon oxide film 206a is set to be 50 nm.

Next, in order to form an embrittlement layer in the single crystal silicon wafer, hydrogen ions are added to the single crystal silicon wafer by using an ion doping apparatus. A 100% hydrogen gas is used as a source gas, and the single crystal silicon wafer substrate is irradiated with ions in plasma that has been generated by excitation of the hydrogen gas and accelerated by an electric field without mass separation. Accordingly, the embrittlement layer is formed. The hydrogen ion doping is performed under the following conditions: the power output of 100 W, the acceleration voltage of 25 kV, and the dose of $2.2 \times 10^{16}$ ions/cm³.

Next, over the silicon oxide film 206a, the silicon nitride oxide film 206b having a thickness of 50 nm is formed by a plasma-enhanced CVD method. A process gas for formation of the silicon nitride oxide film is $SiH_4$, $N_2O$, $NH_3$, and $H_2$, and the flow ratio is $SiH_4\backslash N_2O\backslash NH_3\backslash H_2=20\backslash 36\backslash 200\backslash 800$. The temperature of the film formation process is 300° C.

After the base substrate 110 and the single crystal semiconductor substrate are subjected to ultrasonic cleaning in pure water and then cleaned with ozone-containing pure water, the surface of the base substrate 110 and the silicon nitride oxide film 206b formed on the surface of the single crystal semiconductor substrate are arranged in close contact with each other and bonded to each other. Next, to perform separation at the embrittlement layer, heat treatment is performed at 200° C. for 2 hours in a heating furnace, and then heating is successively performed at 600° C. for 4 hours in the heating furnace. Accordingly, the single crystal semiconductor substrate is separated, and the single crystal semiconductor layer 112 is fixed to the base substrate.

Next, after the surface of the single crystal semiconductor layer 112 is cleaned with pure water, the single crystal semiconductor layer 112 is treated with a 100-fold diluted hydrofluoric acid to remove a native oxide film that is formed on the surface. Then, the surface of the single crystal semiconductor layer 112 is treated with ozone-containing water ($O_3$ water), whereby an oxide film is formed.

Next, the single crystal semiconductor layer 112 is subjected to first etching treatment, whereby the oxide film and the embrittlement layer which has been left on the separation plane of the single crystal semiconductor layer 112 are removed. In this example, the separation plane of the single crystal semiconductor layer 112 is subjected to dry etching treatment, whereby the thickness of the single crystal semiconductor layer 112 is set to be about 95 nm.

Next, the single crystal semiconductor layer 112 is irradiated with a laser beam. For irradiation with the laser beam, a XeCl excimer laser which emits a beam at a wavelength of 308 nm is used. The repetition rate of the laser beam is 30 Hz. Through an optical system, the laser beam is collected such that it has a linear beam shape on an irradiation surface, and scanning with the laser beam is performed in a width direction (a short-axis direction of the beam shape) at 1 mm/sec. The energy density of the laser beam is gradually changed by about 5 mJ/cm$^2$, and irradiation is performed using different types of the energy density. The laser irradiation is performed with a nitrogen gas blown on an irradiated region at a room temperature.

Next, after the surface of the single crystal semiconductor layer 112 is cleaned with pure water, the single crystal semiconductor layer 112 is treated with a 100-fold diluted hydrofluoric acid to remove a native oxide film that is formed on the surface. Then, the surface of the single crystal semiconductor layer 112 is treated with ozone-containing water ($O_3$ water), whereby an oxide film is formed. Then, the single crystal semiconductor layer 112 is subjected to second etching treatment, whereby the thickness of the single crystal semiconductor layer 112 is set to be about 60 nm.

After the second etching treatment is finished, the semiconductor substrate is subjected to heat treatment in a nitrogen atmosphere in a vertical resistance heating furnace. In this embodiment, heat treatment is performed at 600° C. for 4 hours.

In this example, an n-channel TFT is formed using the semiconductor substrate made through the above process. The structure of the n-channel TFT is as follows.

Radical oxidation of the single crystal semiconductor layer 112 is performed, an oxide film with a thickness of 10 nm is formed, and silicon oxynitride is deposited to a thickness of 10 nm over the oxide film, whereby a gate insulating layer having a two-layer structure is formed. Further, over the gate insulating layer, a gate electrode having a two-layer structure in which a tantalum nitride film has a thickness of 30 nm and a tungsten film has a thickness of 370 nm is formed. In addition, the ratio of the channel length (L) of the n-channel TFT to the channel width (W) of the n-channel TFT is: L/W=10/8 μm.

Figure 11:
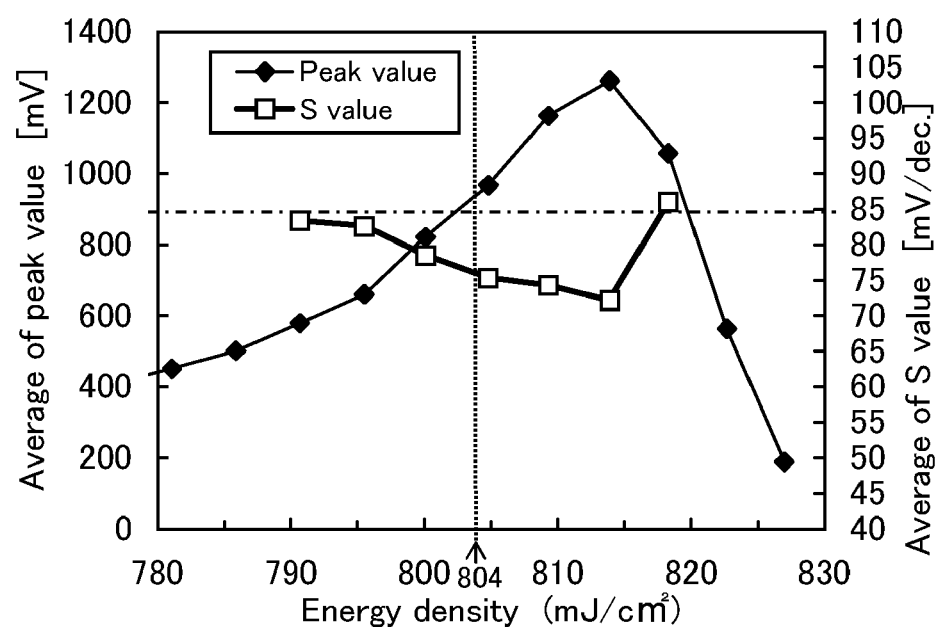
FIG. 11 is a graph illustrating correlations between a peak value of a detection signal of a reflected microwave and TFT characteristics.

FIG. 11 illustrates relations between the energy density of the laser beam with which the single crystal semiconductor layer is irradiated and the peak value of the intensity of a reflected microwave, and relations between the energy density of the laser beam with which the single crystal semiconductor layer is irradiated and the S value of the TFT formed using the single crystal semiconductor layer. In FIG. 11, the horizontal axis represents the energy density of the laser beam, and the vertical axis represents the peak value of the intensity of the reflected microwave or the S value of the TFT.

It is found from FIG. 11 that the energy density ($E1_{max}$) of the monitor substrate when the peak value is the maximum in this example is 814 mJ/cm$^2$, and if a laser beam having the energy density that exceeds the value is emitted, the S value of the TFT is rapidly deteriorated along the microcrystallization of the single crystal semiconductor layer. In addition, since the microcrystallization of the single crystal semiconductor layer occurs in a substrate surface at random, when the single crystal semiconductor layer part of which is microcrystallized is used, variation of characteristics of TFTs increases.

In this example, when variation σ of the energy density E which is emitted to the single crystal semiconductor layers (the sum of variation of $E_{max}$ which depends on the thicknesses of the single crystal semiconductor layers and variation of the energy density of each laser beam with which semiconductor substrates are irradiated) is measured, the variation is 2.57 mJ/cm$^2$. Therefore, the energy density E of each laser beam with which the semiconductor substrates are irradiated preferably satisfies the following Formula 19 to achieve a process capability index of 1.3.

$$0.90E1_{max}+10 \leq E \leq E1_{max}-10 \qquad \text{[Formula 19]}$$

In FIG. 11, the $E1_{max}$ is 814 mJ/cm$^2$; therefore, it is preferable that the energy density E of each laser beam with which the semiconductor substrates are irradiated be greater than or equal to 744 mJ/cm$^2$ and less than or equal to 804 mJ/cm$^2$. When the energy density E of each laser beam is less than or equal to 804 mJ/cm$^2$, the probability of a defective substrate in which the single crystal semiconductor layer is microcrystallized can be suppressed to 50 ppm. In addition, it is preferable that the energy density of each laser beam with which the semiconductor substrates are irradiated be greater than or equal to $(0.95\ E1_{max}+10)$ mJ/cm$^2$, that is, greater than or equal to 784 mJ/cm$^2$.

FIG. 11 illustrates that the S value of the TFT with the use of the single crystal semiconductor layer that is irradiated with a laser beam whose energy density is greater than or equal to 784 mJ/cm$^2$ and less than or equal to 804 mJ/cm$^2$ reaches 85 mV/dec, and favorable characteristics are provided.

As described above, the method for manufacturing a semiconductor substrate according an embodiment of the present invention is used, whereby a semiconductor substrate having a single crystal semiconductor layer with favorable crystallinity and planarity can be formed regardless of variation of the thickness of the single crystal semiconductor layer and variation of a laser. Accordingly, a TFT is formed using the single crystal semiconductor layer, whereby a TFT having favorable characteristics can be formed. In addition, by using the method for manufacturing a semiconductor substrate according an embodiment of the present invention, generation of a defective substrate can be suppressed in a manufacturing process. Therefore, a favorable single crystal semiconductor layer can be formed at low cost.

This application is based on Japanese Patent Application serial No. 2008-257760 filed with Japan Patent Office on Oct. 2, 2008, the entire contents of which are hereby incorporated by reference.

What is claimed is:

1. A method for manufacturing semiconductor substrates, comprising the steps of:

irradiating each of first to n-th (n≧2) single crystal semiconductor substrates with ions to form embrittlement layers in each of the first to n-th single crystal semiconductor substrates;

bonding the first to n-th single crystal semiconductor substrates to first to n-th base substrates, with insulating layers provided on at least one of the single crystal semiconductor substrates and the base substrates and interposed between the first to n-th single crystal semiconductor substrates and the first to n-th base substrates, respectively;

creating first to n-th single crystal semiconductor layers to the first to n-th base substrates, respectively by separation of the first to n-th single crystal semiconductor substrates, along the embrittlement layers by heat treatment;

irradiating a plurality of regions in the first single crystal semiconductor layer having a median of thicknesses of n pieces of the single crystal semiconductor layers with laser beams, wherein each of the plurality of regions is irradiated with a laser beam having different energy density than other laser beams used for irradiation of other regions of the plurality of regions;

detecting a plurality of peak values of detection signals of reflected microwaves of the first single crystal semiconductor layer irradiated with the laser beams, by a microwave photoconductivity decay method, wherein an energy density of a laser beam that corresponds to a maximum peak value of the detected signals is expressed by $E1_{max}$; and irradiating the second to n-th single crystal semiconductor layers with laser beams whose energy density E satisfies the following Formula 1:

$$0.90E1_{max}+3.9\sigma \leq E \leq E1_{max}-3.9\sigma,$$

wherein σ satisfies the following Formula 2:

$$\sigma = \sqrt{(2.87\sigma_d)^2 + \sigma_e^2},$$

wherein $\sigma_d$ represents a standard deviation of thicknesses of n pieces of the single crystal semiconductor layers, and wherein $\sigma_e$ represents a standard deviation of the energy density of the laser beams for irradiation.

2. The method for manufacturing semiconductor substrates according to claim 1, wherein the laser beams are emitted with energy density with which the second to n-th single crystal semiconductor layers are in a partially melted state.

3. The method for manufacturing semiconductor substrates according to claim 1, wherein the laser beams are pulsed laser beams.

4. A method for manufacturing semiconductor substrates, comprising the steps of:

irradiating each of first to n-th (n≧2) single crystal semiconductor substrates with ions to form embrittlement layers in each of the first to n-th single crystal semiconductor substrates;

bonding the first to n-th single crystal semiconductor substrates to first to n-th base substrates, with insulating layers interposed between the first to n-th single crystal semiconductor substrates and the first to n-th base substrates, respectively;

creating first to n-th single crystal semiconductor layers to the first to n-th base substrates, respectively by separation of the first to n-th single crystal semiconductor substrates, along the embrittlement layers by heat treatment;

irradiating a plurality of regions in the first single crystal semiconductor layer with laser beams, wherein each of the plurality of regions is irradiated with a laser beam having different energy density than other, wherein a thickness of the first single crystal semiconductor layer is the same as, or is the closest to a median of thicknesses of n pieces of the single crystal semiconductor layers;

detecting a plurality of peak values of detection signals of reflected microwaves of the first single crystal semiconductor layer irradiated with the laser beams, by a microwave photoconductivity decay method, wherein an energy density of a laser beam that corresponds to a maximum peak value of the detected signals is expressed by $E1_{max}$; and irradiating the second to n-th single crystal semiconductor layers with laser beams whose energy density E satisfies the following Formula 1:

$$0.90E1_{max}+3.9\sigma \leq E \leq E1_{max}-3.9\sigma,$$

wherein σ satisfies the following Formula 2:

$$\sigma = \sqrt{(2.87\sigma_d)^2 + \sigma_e^2},$$

wherein $\sigma_d$ represents a standard deviation of thicknesses of n pieces of the single crystal semiconductor layers, and wherein $\sigma_e$ represents a standard deviation of the energy density of the laser beams for irradiation.

5. The method for manufacturing semiconductor substrates according to claim 4, wherein the laser beams are emitted with energy density with which the second to n-th single crystal semiconductor layers are in a partially melted state.

6. The method for manufacturing semiconductor substrates according to claim 4, wherein the laser beams are pulsed laser beams.

* * * * *